(12) United States Patent
Chang et al.

(10) Patent No.: US 7,107,571 B2
(45) Date of Patent: Sep. 12, 2006

(54) VISUAL ANALYSIS AND VERIFICATION SYSTEM USING ADVANCED TOOLS

(75) Inventors: Fang-Cheng Chang, Sunnyvale, CA (US); Yao-Ting Wang, Sunnyvale, CA (US); Yagyensh C. Pati, Woodside, CA (US); Linard Karklin, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 983 days.

(21) Appl. No.: 09/906,920

(22) Filed: Jul. 16, 2001

(65) Prior Publication Data

US 2002/0035461 A1    Mar. 21, 2002

Related U.S. Application Data

(63) Continuation-in-part of application No. 09/130,996, filed on Aug. 7, 1998, now Pat. No. 6,757,645.

(60) Provisional application No. 60/059,306, filed on Sep. 17, 1997.

(51) Int. Cl.
G06F 17/50    (2006.01)

(52) U.S. Cl. .......................................... 716/19; 716/21

(58) Field of Classification Search ............. 716/19–21; 430/5, 22, 30
See application file for complete search history.

(56) References Cited

U.S. PATENT DOCUMENTS

| | | | |
|---|---|---|---|
| 5,282,140 A | 1/1994 | Tazawa et al. ............... 364/468 |
| 5,326,659 A | 7/1994 | Liu et al. ....................... 430/5 |
| 5,340,700 A | 8/1994 | Chen et al. .................. 430/312 |
| 5,432,714 A | 7/1995 | Chung et al. ................ 364/525 |
| 5,572,598 A | 11/1996 | Wihl et al. ................... 382/144 |
| 5,786,112 A | 7/1998 | Okamoto et al. |
| 5,795,688 A | 8/1998 | Burdorf et al. ............... 430/30 |
| 5,801,954 A | 9/1998 | Le et al. ..................... 364/488 |
| 5,804,340 A | 9/1998 | Garza et al. ................... 430/5 |
| 5,807,649 A * | 9/1998 | Liebmann et al. ............. 430/5 |
| 5,815,685 A | 9/1998 | Kamon ....................... 395/500 |
| 5,825,647 A | 10/1998 | Tsudaka ................ 364/167.03 |
| 5,849,440 A * | 12/1998 | Lucas et al. ................... 430/5 |

(Continued)

FOREIGN PATENT DOCUMENTS

WO    WO 97/13370    4/1997

(Continued)

OTHER PUBLICATIONS http://www.sematech.org/resources/litho/meetings/mask/20010711/O_DATA-FORMAT-BO.pdf, "Mask Data Format Standardization," Jul. 11, 2001, pp. 1-11.

(Continued)

*Primary Examiner*—Vuthe Siek
*Assistant Examiner*—Binh Tat
(74) *Attorney, Agent, or Firm*—Beaver, Hoffman & Harms, LLP; Jeanette S. Harms

(57) ABSTRACT

A system and method of analyzing defects on a mask used in lithography are provided. A defect area image is provided as a first input, a set of lithography parameters is provided as a second input, and a set of metrology data is provided as a third input. The defect area image comprises an image of a portion of the mask. A simulated image can be generated in response to the first input. The simulated image comprises a simulation of an image that would be printed on a wafer if the wafer were exposed to a radiation source directed at the portion of the mask. The characteristics of the radiation source comprise the set of lithography parameters and the characteristics of the mask comprise the set of metrology data.

60 Claims, 22 Drawing Sheets

U.S. PATENT DOCUMENTS

| | | | |
|---|---|---|---|
| 5,862,058 A | 1/1999 | Samuels et al. ............ 364/491 |
| 6,009,250 A | 12/1999 | Ho et al. ............... 395/500.06 |
| 6,009,251 A | 12/1999 | Ho et al. ............... 395/500.06 |
| 6,011,911 A | 1/2000 | Ho et al. ............... 395/500.06 |
| 6,016,357 A | 1/2000 | Neary et al. ................ 382/144 |
| 6,076,465 A | 6/2000 | Vacca et al. ................ 101/481 |
| 6,078,738 A | 6/2000 | Garza et al. ........... 395/500.22 |
| 6,081,659 A | 6/2000 | Garza et al. ........... 395/500.22 |
| 6,130,750 A | 10/2000 | Ausschnitt et al. ......... 356/401 |
| 6,171,731 B1 | 1/2001 | Medvedeva et al. ........... 430/5 |
| 6,370,679 B1* | 4/2002 | Chang et al. ................. 716/19 |
| 6,436,590 B1* | 8/2002 | Wang et al. .................... 430/5 |
| 6,498,685 B1* | 12/2002 | Johnson ...................... 359/626 |
| 6,614,924 B1 | 9/2003 | Aghajan |
| 6,691,052 B1 | 2/2004 | Maurer |
| 6,757,645 B1 | 6/2004 | Chang et al. |
| 6,802,045 B1 | 10/2004 | Sonderman et al. |
| 2002/0019729 A1 | 2/2002 | Chang et al. .................. 703/6 |
| 2002/0035461 A1 | 3/2002 | Chang et al. ................. 703/13 |
| 2003/0161525 A1 | 8/2003 | Bruce et al. |
| 2004/0133369 A1 | 7/2004 | Pack et al. |

FOREIGN PATENT DOCUMENTS

| | | |
|---|---|---|
| WO | WO 98/20327 | 5/1998 |
| WO | WO 98/45685 | 10/1998 |
| WO | WO 99/14706 A2 | 3/1999 |
| WO | WO 99/14706 A3 | 3/1999 |
| WO | WO 00/36525 A2 | 6/2000 |
| WO | WO 00/67074 A1 | 11/2000 |
| WO | WO 00/67075 A1 | 11/2000 |
| WO | WO 00/67076 A1 | 11/2000 |

OTHER PUBLICATIONS

Lin, B.J., et al., "Single-Level Electric Testsites for Phase-Shifting Masks", SPIE, vol. 1673, pp. 221-228, Mar. 9-11, 1992.

Spence, C., et al., "Detection of 60(degree) Phase Defects on Alternating PSMs", Advanced Micro Devices, KLA-Tencor, DuPont RTC (2 pages).

Sugawara, M., et al., "Defect Printability Study of Attenuated Phase-Shifting Masks for Specifying Inspection Sensitivity", Sony Corporation, Kanagawa, Japan (16 pages).

Ogawa, K., et al., "Phase Defect Inspection by Differential Interference", Lasertec Corporation (12 pages).

Kang, D., et al., "Effects of Mask Bias on t he Mask Error Enhancement Factor (MEEF) of Contact Holes" (11 pages).

Socha, R., et al., "Printability of Phase-Shift Defects Using a Perturbational Model", Univ. of California Berkeley, Sematech (11 pages).

Erdmann, A., "Topography Effects and Wave Aberrations in Advanced PSM-Technology", Fraunhofer Institute of Integrated Circuits (11 pages).

Fiekowsky, P., "The End of Thresholds: Subwavelength Optical Linewidth Measurement Using the Flux-Area Technique". Automated Visual Inspection (6 pages).

Nguyen, K., et al., "Printability of Substrate and Absorber Defects on Extreme Ultraviolet Lithographic Masks", Sandia National Labs, AT&T Bell Labs (18 pages).

Neureuther, A., "Modeling Phase Shifting Masks", SPIE, 10th Annual Symposium On Microlithography, vol. 1496, pp. 80-85 (1990).

Watanabe, H., et al., "Detection and Printability of Shifter Defects in Phase-Shifting Masks", Japanese Journal of Applied Physics, vol. 30, No. 11B, pp. 3016-3020, Nov. 1991.

Watanabe, H., et al., "Detection and Printability of Shifter Defects in Phase-Shifting Masks II Defocus Characteristics", Jpn. J. Appl. Phys., vol. 31, pp. 4155-4160 (1992).

Rothschild, M., et al., "Photolithography at 193nm", J. Vac. Sci. Technol. B, vol. 10, No. 6, pp. 2989-2996, Nov./Dec. 1992.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229-235 (1992).

Wiley, J., et al., "Device Yield and Reliability by Specification of Mask Defects", Solid State Technology, vol. 36, No. 7, pp. 65-66, 70, 72, 74, 77, Jul. 1993.

Ohtsuka, H., et al., "Evaluation of Repair Phase and Size Tolerance for a Phase-Shift Mask", J. Vac. Sci. Technol. B, vol. 11, No. 6, pp. 2665-2668, Nov./Dec. 1993.

Reynolds, J., "Elusive Mask Defects: Reflectivity Variations", Solid State Technology, pp. 75-76, Mar. 1995.

Kusunose, H., et al., "Direct Phase-Shift Measurement with Transmitted Deep-UV Illumination", SPIE, vol. 2793, pp. 251-260 (1996).

Morimoto, H., et al., "Next Generation Mask Strategy—Technologies are Ready for Mass Production of 256MDRAM?", SPIE, vol. 3236, pp. 188-189 (1997).

Ausschnitt, C., et al., "Advanced DUV Photolithography in a Pilot Line Environment", IBM J. Res. Develop., vol. 41, No. 1/2, pp. 21-37, Jan./Mar. 1997.

Brunner, T., "Impact of Lens Aberrations on Optical Lithography", IBM J. Res. Develop., vol. 41, No. 1/2, pp. 57-67. Jan./Mar. 1997.

Hawryluk, A., et al., "EUV Lithography", Miicrolithography World, pp. 17-18 & 20-21, Summer 1997.

Holmes, S., et al., "Manufacturing with DUV Lithography", IBM J. Res. Develop., vol. 41, No. 1/2, pp. 7-19, Jan./Mar. 1997.

Rothschild, M., et al., "Lithography at a Wavelength of 193nm", IBM J. Res. Develop., vol. 41, No. 1/2, pp. 49-55 Jan./Mar. 1997.

Tsujimoto, E., et al., "Hierarchical Mask Data Design System (PROPHET) for Aerial Image Simulation, Automatic Phase-Shifter Placement, and Subpeak Overlap Checking", SPIE, vol. 3096, pp. 163-172 (1997).

Schoerunaker, W., et al., "Theory and Implementation of a New Interpolation Method Based on Random Sampling", IMEC Technology Paper, pp. 1-35, Jan. 31, 1997.

Cobb, et al., "Fast Sparse Aerial Image Calculation for OPC", SPIE, vol. 2621, pp. 534-544.

Stimiman, J., et al., "Spatial Filter Models to Describe IC Lithographic Behavior", Precim Corporation, Portland, Oregon (10 pages).

Adam, K., et al., "Simplified Models for Edge Transitions in Rigorous Mask Modeling", University of California Berkeley (40 pages).

Gordon, R., et al., "Mask Topography Simulation for EUV Lithography", FINLE Technologies Inc. (15 pages).

Pistor, T., "Rigorous 3D Simulation of Phase Defects in Alternating Phase-Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Neureuther, A., et al., "Modeling Defect-Feature Interactions in the Presence of Aberrations", University of California Berkeley (10 pages).

Mathur, B.P., et al., "Quantitative Evaulation of Shape of Image on Photoresist of Square Apertures", IEEE, Transactions On Electron Devices, vol. 35, No. 3, pp. 294-297, Mar. 1988.

Henke, W., et al., "A Study of Reticle Defects Imaged Into Three-Dimensional Developed Profiles of Positive Photoresist Using the Solid Lithography Simulator", Microelectronics Eng., vol. 14, pp. 283-297 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346-355 (1991).

Ohtsuka, H., et al., "Phase Defect Repair Method for Alternating Phase Shift Masks Conjugate Twin-Shifter Method", Jpn. J. Appl. Phys., vol. 31, pp. 4143-4149 (1992).

Crisalle, O., et al., "A Comparison of the Optical Projection Lithography Simulators in SAMPLE and PROLITH", IEEE, Transactions On Semiconductor Manufacturing, vol. 5, No. 1, pp. 14-26, Feb. 1992.

Nistler, J., et al., "Phase Shift Mask Defect Printability Analysis", Proceedings Of The Microlithography Seminar INTERFACE '93, OCG Microelectronic Materials, Inc., pp. 11-28 (1993).

Rieger, M., et al., "System for Lithography Proximity Compensation", Precim Company, Portland, Oregon, Sep. 1993 (28 pages).

Pati, Y.C., et al., "Phase-Shifting Masks for Microlithography: Automated Design and Mask Requirements", J. Opt. Soc. Am., vol. 11, No. 9, pp. 2438-2452, Sep. 1994.

Spence, C., et al., "Automated Determination of CAD Layout Failures Through Focus: Experiment and Simulation", SPIE, vol. 2197, pp. 302-313 (1994).

Qian, Q.D., et al., "A New Scalar Planewave Model for High NA Lithography Simulations", IEEE, pp. 45-48 (1994).

Karklin, L., "A Comprehensive Simulation Study of the Photomask Defects Printability", SPIE, vol. 2621, pp. 490-504 (1995).

Wiley, J., et al., "The Effects of Off-Axis Illumination on the Printability of Opaque and Transparent Reticle Defects", SPIE, vol. 2512, pp. 432-440 (1995).

Brunner, T., et al., "Approximate Models for Resist Processing Effects", SPIE, vol. 2726, pp. 198-207, Mar. 1996.

Chang, K., et al., "Accurate Modeling of Deep Submicron Interconnected Technology", TMA Times, vol. IX, No. 3 (1997).

Gans, F., et al., "Printability and Repair Techniques for DUV Photomasks", SPIE, Proceedings Of The 17th Annual Symposium On Photomask Technology And Management, vol. 3236, pp. 136-141 (1997).

Ibsen, K., et al., "Clear Field Reticle Defect Diposition for Advanced Sub-Half Micron Lithography", SPIE, Proceedings Of The 17th Annual Symposium On Photomask Technology And Management, vol. 3236, pp. 124-135 (1997).

Pati, Y.C., et al., "Exploiting Structure in Fast Aerial Image Computation for Integrated Circuit Patterns", IEEE Transactions On Semiconductor Manufacturing, vol. 10, No. 1, pp. 62-74, Feb. 1997.

Vacca, A., et al., "100nm Defect Detection Using a Dynamically Programmable Image Processing Algorithm", SPIE, vol. 3236 (1997) (Abstract Only).

Kubota, H., et al., "A Fast Method of Simulating Resist Pattern Contours Based on Mean Inhibitor Concentration", Jpn. J. Appl. Phys., vol. 37, pp. 5815-5820 (1998).

Vacca, A., et al., "100nm Defect Detection Using an Existing Image Acquisition System", SPIE, vol. 3236, pp. 208-221 (1998).

Fukuda, H., et al., "Determination of High-Order Lens Aberration Using Phase/Amplitude Linear Algebra", J. Vac. Sci. Technol. B, vol. 17, No. 6, pp. 3318-3321, Nov./Dec. 1999.

Fukuda, H., "Node-Connection/Quantum Phase-Shifting Mask: Path to Below 0.3um Pitch, Proximity Effect Free, Random Interconnects and Memory Patterning", J. Vac. Sci. Technol. B, vol. 17, No. 6, pp. 3291-3295, Nov./Dec. 1999.

Balasinski, A., et al., "A Novel Approach to Simulate the Effect of Optical Proximity on MOSFET Parametric Yield", IEEE, pp. 37.6.1-37.6.4 (1999).

Balasinski, A., et al., "Comparison of Mask Writing Tools and Mask Simulations for 0.16um Devices", IEEE, SEMI Advanced Semiconductor Manufacturing Conference, pp. 372-377 (1999).

\* cited by examiner

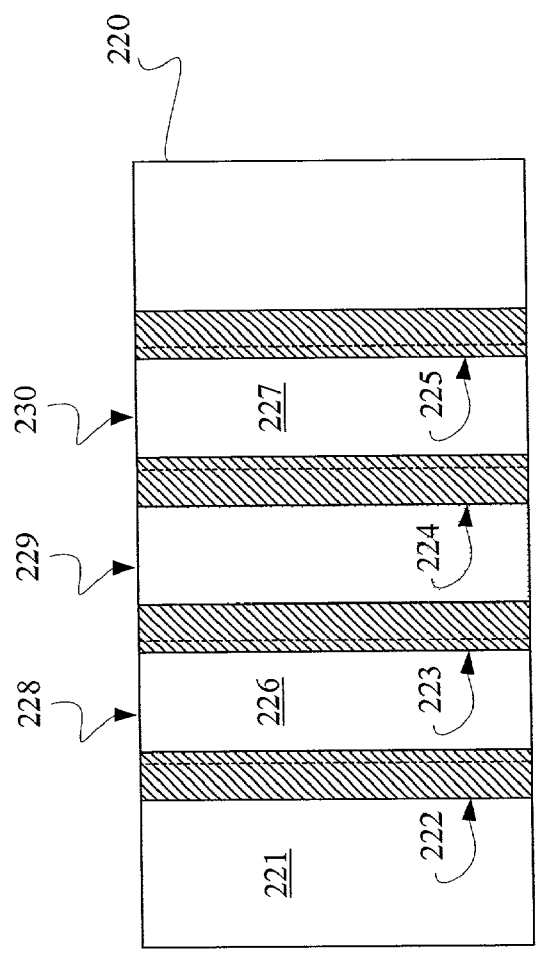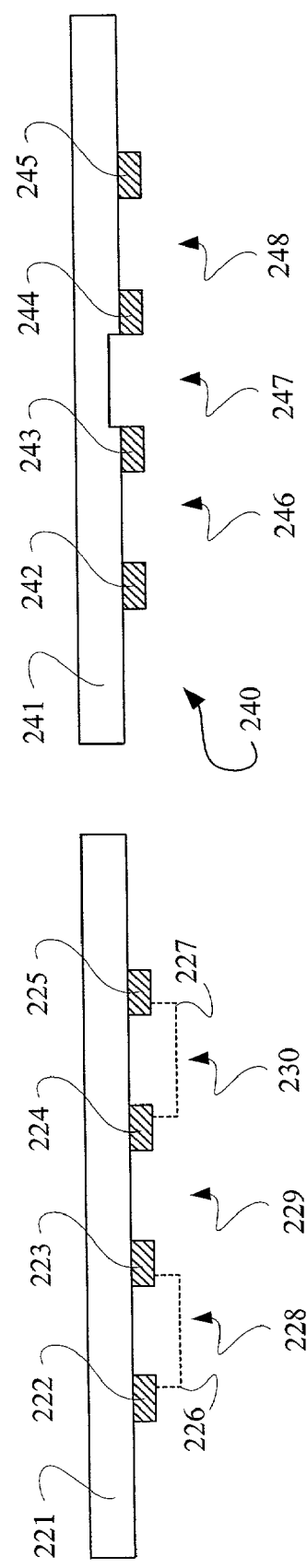

VISUAL ANALYSIS AND VERIFICATION SYSTEM USING ADVANCED TOOLS

RELATED APPLICATIONS

This application is a continuation-in-part of U.S. patent application Ser. No. 09/130,996, entitled "Visual Inspection and Verification System", filed Aug. 7, 1998 now U.S. Pat. No. 6,757,645, which is based on Provisional Application 60/059,306 filed Sep. 17, 1997, invented by Fang-Cheng Chang, Yao-Ting Wang, Yagyensh C. Pati, and Linard Karklin, assigned to the assignee of the present invention, and incorporated by reference herein.

BACKGROUND OF THE INVENTION

1. Field of the Invention

This invention relates to the field of integrated circuit manufacturing. In particular, the invention relates to a system for analyzing defects on binary intensity masks, phase-shifting masks and next generation lithography (NGL) masks used in the manufacture of integrated circuits.

2. Description of Related Art

In designing an integrated circuit (IC), engineers typically rely upon computer simulation tools to help create a circuit schematic design consisting of individual devices coupled together to perform a certain function. To actually fabricate this circuit in a semiconductor substrate the circuit must be translated into a physical representation, or layout, which itself can then be transferred onto a template (i.e. a mask), and then to the silicon surface. Again, computer aided design (CAD) tools assist layout designers in the task of translating the discrete circuit elements into shapes, which will embody the devices themselves in the completed IC. These shapes make up the individual components of the circuit, such as gate electrodes, field oxidation regions, diffusion regions, metal interconnections, and so on.

Once the layout of the circuit has been created, the next step to manufacturing the integrated circuit is to transfer the layout onto a semiconductor substrate. One way to do this is to use the process of optical lithography in which the layout is first transferred onto a physical template, which is in turn used to optically project the layout onto a silicon wafer. Other types of wafers can be used, e.g. silicon germanium, etc.

In transferring the layout to a physical template, a mask (usually. a quartz plate coated with chrome) is generally created for each layer of the integrated circuit design. This is done by inputting the data representing the layout design for that layer into a device, such as an electron beam machine, which writes the integrated circuit layout pattern into the mask material. In less complicated and dense integrated circuits, each mask comprises the geometric shapes that represent the desired circuit pattern for its corresponding layer. In more complicated and dense circuits in which the size of the circuit features approach the optical limits of the lithography process, the masks may also comprise sub-lithographic, optical proximity correction features, such as serifs, hammerheads, bias and assist bars, designed to compensate for proximity effects. In other advanced circuit designs, phase-shifting masks may be used to circumvent certain basic optical limitations of the process by enhancing the contrast of the optical lithography process.

These masks are then used to optically project the layout onto a silicon wafer coated with photoresist material. For each layer of the design, a light (visible/non-visible radiation) is shone on the mask corresponding to that layer via a visible light source or an ultra-violet light source. This light passes through the clear regions of the mask, whose image exposes the underlying photoresist layer, and is blocked by the opaque regions of the mask, thereby leaving that underlying portion of the photoresist layer unexposed. The exposed photoresist layer is then developed, typically through chemical removal of the exposed/non-exposed regions of the photoresist layer. The result is a semiconductor wafer coated with a photoresist layer exhibiting a desired pattern, which defines the geometries, features, lines and shapes of that layer. This process is then repeated for each layer of the design.

As integrated circuit designs become more complicated, it becomes increasingly important that the masks used in photolithography are accurate representations of the original design layout. Unfortunately, the electron beam and other machines used to manufacture these masks are not error-free. Thus, in the typical manufacturing process, some mask defects do occur outside the controlled process.

A defect on a mask is anything that is different from the design database and is deemed intolerable by an inspection tool or an inspection engineer. A photolithographic mask can comprise a plurality of opaque areas (typically made of chrome) and a plurality of clear areas (typically made of quartz). In a bright field mask, the background is clear and the circuit pattern is defined by opaque areas. In a dark field mask, the background is opaque and the circuit pattern is defined by clear areas. Common mask defects that occur during a bright field mask manufacturing process include, for example, an isolated opaque pinhole defect in a clear area, an isolated clear spot defect in an opaque area, an edge intrusion defect in an opaque area, an edge protrusion defect in a clear area, a geometry break defect in an opaque area, and a geometry bridge defect in a clear area. Similar type defects can occur in a dark field mask manufacturing process. Defects may also occur in the sub-resolution optical proximity correction (OPC) features provided on the chip. These OPC features could include, for example, serifs, hammerheads, and assist lines.

FIG. 1 illustrates a known method of analyzing a mask for one or more of the above-described defects. After designing an integrated circuit 100 and creating a data file 110, the mask design data is provided to a device such as an electron beam or laser writing machine and a mask is manufactured 115. The mask is then inspected for defects as shown in step 120. In this inspection, the surface of the mask can be scanned with a high resolution microscope (e.g. optical, scanning electron, focus ion beam, atomic force, and near-field optical microscopes) and capturing images of the mask. These mask images can then be observed off-line by an engineer or on-line by a mask fabrication worker to identify defects on the physical mask. Then, a decision is made in step 125 whether the inspected mask is good enough for use in the lithography process. This decision can be made off-line by a skilled inspection engineer or on-line by a fabrication worker, possibly with the aid of inspection software. If there are no defects, or defects are discovered but determined to be within tolerances set by the manufacturer or end-user, then the mask passes inspection and can be used to expose a wafer in step 140. If defects are discovered that fall outside tolerances, then the mask fails inspection and a decision is made in step 130 as to whether the mask can be cleaned and/or repaired to correct the defects in step 135, or whether the defects are so severe that a new mask must be manufactured (returning to step 115). This process is continued until a manufactured mask passes inspection.

Once a physical mask is produced that passes inspection, the mask is further inspected to ensure that the mask will produce the desired image on a photoresist after a wafer is exposed to light through the mask. Typically, this inspection includes exposing and processing a wafer in step 140 using the inspected mask. The processed wafer is then inspected in step 145, and a decision is made in step 150 as to whether there are any defects and whether the defects fall within tolerances. If discovered defects are substantial, then, as before, a decision is made in step 130 whether the defects can be repaired or whether a new mask must be produced in step 115. This process is continued until a mask is manufactured that will produce desired wafer patterns and that will pass the wafer level inspection, thereby ending inspection in step 160. This mask is then used in the lithography process to expose the corresponding layer in the overall manufacturing process.

The goal of defect inspection is to correctly identify a defect to avoid a failed wafer processing. However, not all mask defects are important with respect to the desired result, i.e. an accurate representation of the original design layout on the photoresist material or etched into silicon. Specifically, not all mask defects will "print." Loosely speaking, the printability of a defect is how a defect would impact the outcome of a given photolithography and/or etching process. Because the printability of a defect is mainly associated with the stepper exposure conditions, a defect can be "not printable" for a particular set of stepper exposure conditions and "printable" under a different set of stepper exposure conditions. These conditions for optics based lithography can include, for example, defect size, wavelength, numerical aperture, coherence factor, illumination mode, exposure time, exposure focus/defocus, and the reflection/transmission characteristics of the defect.

Currently, inspection tools that are in use include tools that inspect masks both on-line (i.e. within the production line) and off-line. Conventional on-line inspection tools typically scan the entire mask area looking for defect areas, and some may also compare the inspected result with the mask layout database when defects are detected. However, the defect analysis of the typical on-line inspection tools are based primarily (or solely) on the size of the defect picked up by the optics to define the severity of a particular defect. While this scheme has been somewhat successful in the past, current masks are designed with smaller and smaller features that include advanced and unconventional methods such as OPC. Due to these changes, conventional methods of inspection are rapidly proving to be inadequate because they do not address several issues.

First, whether a defect prints or not greatly depends on both its location and size, not just size or transmission/reflection/phase characteristics alone. For example, a large defective spot in an isolated area may have little or no effect on the current and subsequent process layers. On the other hand, a small spot near a corner, an edge, or a critical area should not be dismissed without closer examination. This is true for both conventional binary masks and advanced masks. Second, advanced OPC mask features can trigger false defect detections. A conventional scheme can falsely report an OPC feature or an imperfect OPC feature as a defect, when this feature actually has little impact on the end result. Although some existing mask inspection tools have a sliding scale setting to "tolerate" OPC features, this is not a robust method because defects associated with these special features may be overlooked because of this arbitrary scale. Additionally, OPC features are typically designed for a specific set of stepper parameters, whereas sliding scales are blind to these stepper parameters. Third, phase information is not properly incorporated into consideration, if at all, in conventional defect inspection methods. Therefore, phase-shifting masks are not properly inspected. Finally, even though a defect may not appear to print, the defect can affect the process latitude in a way that will decrease yield and not be detected by conventional on-line defect inspection systems.

Off-line inspection stations, which either scan for defects directly or review previously stored undetermined defect data from an on-line tool, face the same issues. In addition, an a engineer having the requisite expertise may be needed to resolve these issues, thereby diminishing throughput while significantly increasing cost. Although an engineer's judgment can greatly reduce the magnitude of the defect printability problem, still, there is not enough certainty and accuracy until the defect is viewed as it appears on an actual wafer after exposure through the mask. This is especially true in current lithography steppers using non-standard illumination modes such as annular and quadruple. Thus, using currently existing inspection systems, it is nearly impossible to judge a defect's printability without actually printing the mask onto a wafer, which is expensive and time-consuming.

Accordingly, in any mask inspection system, the important decision to be made is whether a given defect will "print" on the underlying photoresist in a lithography process under specified conditions. If a mask defect does not print or have other effects on the lithography process (such as unacceptably narrowing the lithography process window), then the mask with the defect can still be used to provide acceptable lithography results. Therefore, one can avoid the expense in time and money of repairing and/or replacing masks whose defects do not print. What is desired then, is a method and apparatus for analyzing masks used in the lithography process that solve the aforementioned problems of currently existing mask inspection systems.

SUMMARY OF THE INVENTION

Emerging lithography technologies, such as phase-shifting and extreme ultraviolet, strive to improve the resolution of features on a wafer while decreasing the size of these features, thereby allowing more complex patterns to be printed on the wafer. In accordance with one aspect of the present invention, a simulation technique can be used to assess the effect of a mask defect on the printing process. To more accurately make this assessment, the simulation can take into account certain lithography parameters relating to the radiation source as well as certain metrology data relating to the mask.

In one embodiment, a method of analyzing for defects on a mask used in lithography is provided. The method includes providing a defect area image as a first input, a set of lithography parameters as a second input, and a set of metrology data as a third input. The defect area image comprises an image of a portion of the mask. In the method, a first simulated image is generated in response to the first input. The first simulated image comprises a simulation of an image that would be printed on a wafer if the wafer were exposed to a radiation source directed at the portion of the mask. Of importance, the characteristics of the radiation source comprise the set of lithography parameters and the characteristics of the mask comprise the set of metrology data.

Providing the defect area image can include providing a set of potential defect criteria, scanning the mask for features whose characteristics fall within the set of potential defect criteria, and generating the defect area image in response to the scanning of the mask if at least one feature's characteristics fall within the set of potential defect criteria is identified. The mask can be scanned by an optical microscope, a scanning electron microscope, a focus ion beam microscope, an atomic force microscope, or a near-field optical microscope, for example.

The radiation source can include a visible illumination source, a non-visible illumination source, or a plasma discharge. Typically, the set of lithography parameters can include data representing at least one parameter of a group of parameters including numerical aperture, wavelength, sigma, lens aberration, defocus, and critical dimension.

The mask used in the method can include an attenuated phase-shifting mask, a tri-tone attenuated phase-shifting mask, an alternating phase-shifting mask, or an extreme ultraviolet (EUV) mask. In one embodiment, the set of metrology data relating to the mask can include data representing measurements including a phase associated with the defect area image and a transmission associated with the defect area image. In another embodiment, the set of metrology data can include specification data including a phase associated with the defect area image and a transmission associated with the defect area image. In another embodiment, the set of metrology data can include data representing at least one measurement including a reflectivity of the mask. In yet another embodiment, the set of metrology data can include specification data including a reflectivity of the mask.

In accordance with another aspect of this method, a set of photoresist process parameters can be provided as a fourth input and a second simulated image can be generated in response to the fourth input. The second simulated image comprises a simulation of an image which would be printed on the wafer if the wafer were exposed to the radiation source directed at the portion of the mask, wherein the wafer comprises a coating of photoresist material characterized by the set of photoresist process parameters. In accordance with yet another feature of this method, a set of etching process parameters can be provided as a fifth input and a third simulated image can be generated in response to the fifth input. The third simulated image comprises a simulation of an image that would be transferred on the wafer if the wafer were etched in accordance with the etching process parameters after the exposure to the radiation source. The set of etching process parameters can comprise data representing etching time, etching method, or concentration.

The method can also include providing a reference description of the portion of the mask and providing a reference image. The reference image comprises a representation of an image that would be printed on a wafer if the wafer were exposed to the radiation source directed at a second mask, wherein the second mask comprises a mask described by the reference description. In one embodiment, the reference description comprises a physical mask determined to be free from defects. In another embodiment, the reference description comprises data in a format such as GDS-II, MEBES, CFLAT, or digitized data.

The method can include comparing the first simulated image with the reference image. The step of comparing can include generating a first process window related output in response to the first simulated image, generating a second process window related output in response to the reference image, and comparing the first process window related output with the second process window related output. Generating the first process window related output can include providing a set of wafer image acceptance criteria and generating a first range of values for at least one parameter comprising the first set of lithography parameters, wherein within the first range the first simulated image falls either inside or outside the set of wafer image acceptance criteria. Generating the second process window related output can include generating a second range of values for the at least one parameter comprising the first set of lithography parameters, wherein within the second range the reference image falls either inside or outside the set of wafer image acceptance criteria.

A program storage device readable by a machine, tangibly embodying a program of instructions executable by the machine to perform method steps to analyze a mask used in lithography is also provided. The method includes receiving a defect area image as a first input, receiving a set of lithography parameters as a second input, and receiving a set of metrology data as a third input. A first simulated image is generated in response to the first input, wherein the first simulated image comprises a simulation of an image that would be printed on a wafer if the wafer were exposed to a radiation source directed at a portion of the mask. The characteristics of the illumination source comprise the set of lithography conditions and the characteristics of the mask comprise the set of metrology data. The program storage device can include a hard disk drive or a server.

An apparatus for analyzing a mask used in lithography for defects is also provided. The apparatus can include a resource for receiving a defect area image as a first input, a resource for receiving a set of lithography parameters as a second input, and a resource for receiving a set of metrology data as a third input. An image simulator can generate a first simulated image in response to the first input, wherein the first simulated image comprises a simulation of an image that would be printed on a wafer if the wafer were exposed to a radiation source directed at a portion of the mask. The characteristics of the radiation source comprise the set of lithography parameters and the characteristics of the mask comprise the set of metrology data. The mask can include an attenuated phase-shifting mask, a tri-tone attenuated phase-shifting mask, an alternating phase-shifting mask, or a EUV mask.

In one embodiment, the apparatus further includes a resource for receiving a set of potential defect criteria, a scanning resource that scans the mask for features whose characteristics fall within the set of potential defect criteria, and a resource for generating the defect area image. The scanning resource can comprise an optical microscope, a scanning electron microscope, a focus ion beam microscope, an atomic force microscope, or a near field optical microscope.

The radiation source can include a visible illumination source, a non-visible illumination source, or a plasma discharge. The set of lithography parameters can comprise data representing the numerical aperture, wavelength, sigma, lens aberration, defocus, or critical dimension. In one embodiment, the set of metrology data can comprise data representing measurements including a phase associated with the defect area image and a transmission associated with the defect area image. In another embodiment, the set of metrology data can comprise specification data including a phase associated with the defect area image and a transmission associated with the defect area image. In another embodiment, the set of metrology data can comprise data representing at least one measurement including a reflectivity of the mask. In yet another embodiment, the set of metrology data can comprise specification data including a reflectivity of the mask.

A computer program product is also provided, wherein the computer program product includes computer usable medium having a computer readable program code embodied therein for causing a computer to analyze a mask used in lithography for defects. The code comprises computer readable program code that reads a defect area image of a portion of the mask as a first input, computer readable program code that reads a set of lithography parameters as a second input, and computer readable program code that reads a set of metrology data as a third input. The code further includes computer readable program code that generates a first simulated image in response to the first input, wherein the first simulated image comprises a simulation of an image that would be printed on a wafer if the wafer were exposed to a radiation source directed to a portion of the mask. The characteristics of the radiation source comprise the set of lithography conditions and the characteristics of the mask comprise the set of metrology data.

In one embodiment, the computer readable program code that generates the first simulated image can be calibrated to a set of photoresist process parameters such that the first simulated image comprises a simulation of an image which would be printed on the wafer if the wafer were exposed to the radiation source directed at the portion of the mask, wherein the wafer comprises a coating of photoresist material characterized by the set of photoresist process parameters. In another embodiment, the computer readable program code that generates the first simulated image can be calibrated to a set of etching process parameters such that the first simulated image comprises a simulation of an image which would be transferred on the wafer if the wafer were etched in accordance with the etching process parameters after the exposure to the radiation source.

The computer program product can further include computer readable program code that receives a reference description of the portion of the mask and computer readable program code that provides a reference image, wherein the reference image comprises a simulation of an image that would be printed on a wafer if the wafer were exposed to the radiation source directed at a second mask. The second mask comprises a mask described by the reference description. Additional computer readable program code compares the first simulated image with the reference image and analyzes the first simulated image for defects on the mask. The computer usable medium can comprise a hard disk drive or a server.

A system for analyzing a mask used in lithography for defects is also provided. The system includes means for receiving a defect area image as a first input, means for receiving a set of lithography parameters as a second input, and means for receiving a set of metrology data as a third input. The system further includes means for generating a first simulated image in response to the first input, wherein the first simulated image comprises a simulation of an image that would be printed on a wafer if the wafer were exposed to a radiation source directed at a portion of the mask. The characteristics of the radiation source comprise the set of lithography parameters and the characteristics of the mask comprise the set of metrology data.

A mask in accordance with the present invention includes a pattern representing an integrated circuit layout and at least one analyzed feature in the pattern. The analysis of that feature includes providing a defect area image as a first input, providing a set of lithography parameters as a second input, providing a set of metrology data as a third input, and generating a first simulated image in response to said first input. The first simulated image comprises a simulation of an image that would be printed on a wafer if the wafer were exposed to a radiation source directed at a portion of said mask. The characteristics of the radiation source comprise the set of lithography parameters, and wherein the characteristics of the mask comprise the set of metrology data.

An integrated circuit in accordance with the present invention is fabricated using a method comprising: providing a mask including a pattern representing a layout of the integrated circuit, analyzing the mask, repairing the mask, if necessary, based on a first simulated image of the mask, and exposing the mask and transferring the pattern to the wafer, thereby forming the integrated circuit. The step of analyzing includes providing a defect area image as a first input, providing a set of lithography parameters as a second input, providing a set of metrology data as a third input, and generating the first simulated image in response to the first input. Specifically, the first simulated image comprises a simulation of an image that would be printed on a wafer if the wafer were exposed to a radiation source directed at the portion of the mask. In one aspect of the present invention, the characteristics of the radiation source comprise the set of lithography parameters and the characteristics of the mask comprise the set of metrology data.

BRIEF DESCRIPTION OF THE DRAWINGS

FIGS. 2(e)–(f) illustrate a planar view and a cross section view of a plurality of features on an alternating phase-shifting mask, respectively.

FIG. 2(g) illustrates a cross section view of another embodiment of an alternating phase-shifting mask.

DETAILED DESCRIPTION OF THE DRAWINGS

Lithography is a process whose input is a mask and whose output includes the printed patterns on a wafer. As printed patterns on the substrate become more complex, a need arises to decrease the feature size. However, as feature sizes shrink, the resolution limits of current optical-based systems are approached. Specifically, as described above, a photolithographic mask can include clear regions and opaque regions, wherein the pattern of these two regions defines the features of a particular semiconductor layer. Under exposure conditions, diffraction effects at the transition of the transparent regions to the opaque regions can render these edges indistinct, thereby adversely affecting the resolution of the lithographic process. Various techniques have been proposed to improve the resolution. One such technique, phase-shifting, uses phase destructive interference of the waves of incident light. Specifically, phase-shifting shifts the phase of a first region of incident light waves approximately 180 degrees relative to a second, adjacent region of incident light waves. Therefore, the projected images from these two regions destructively interfere where their edges overlap, thereby creating a clear separation between the two images. Thus, the boundary between exposed and unexposed portions of a resist illuminated through a semiconductor mask can be more closely defined by using phase-shifting, thereby allowing greater structure density on the IC.

Figure 1:
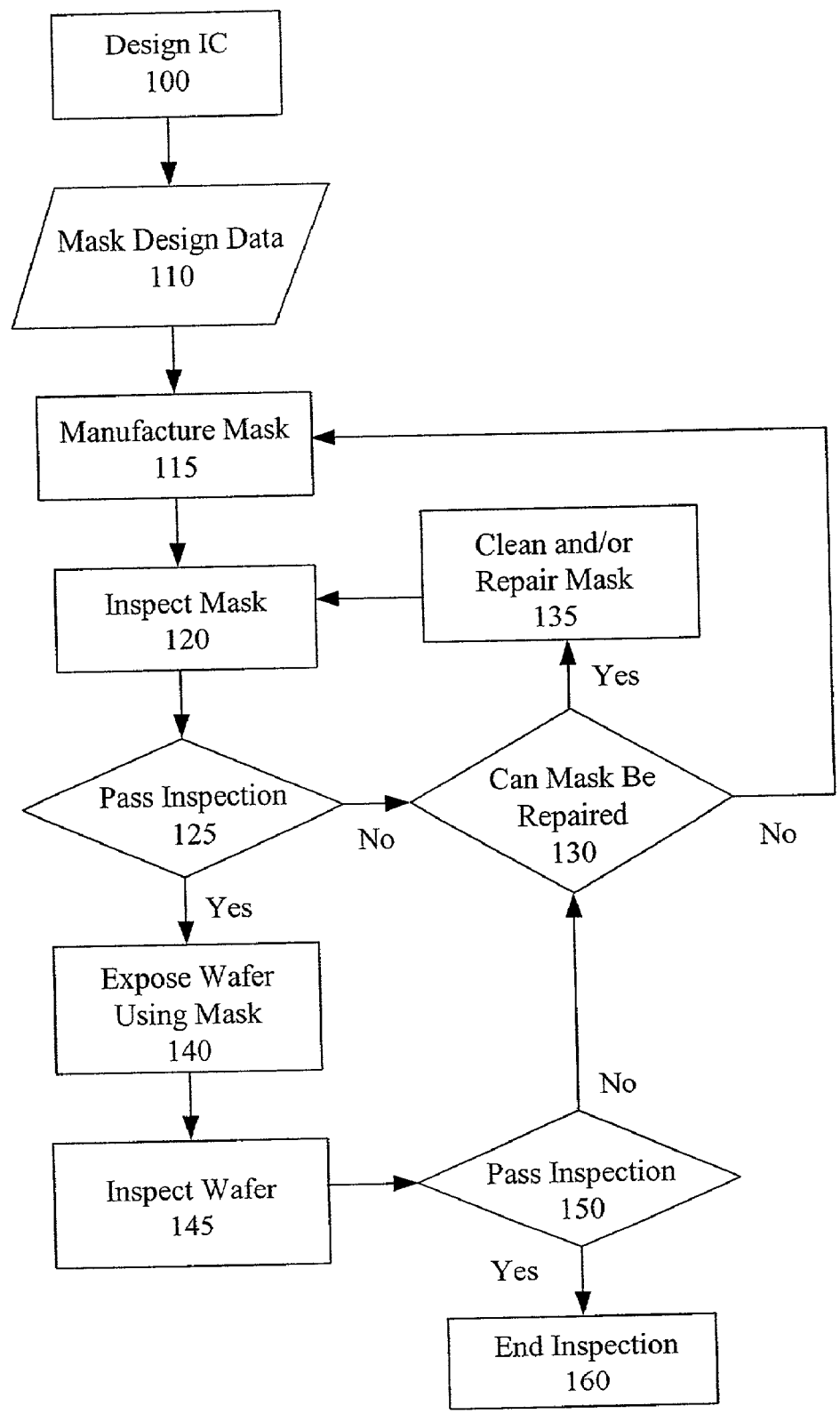
FIG. 1 illustrates one known method of analyzing mask defects.
Figure 2A:
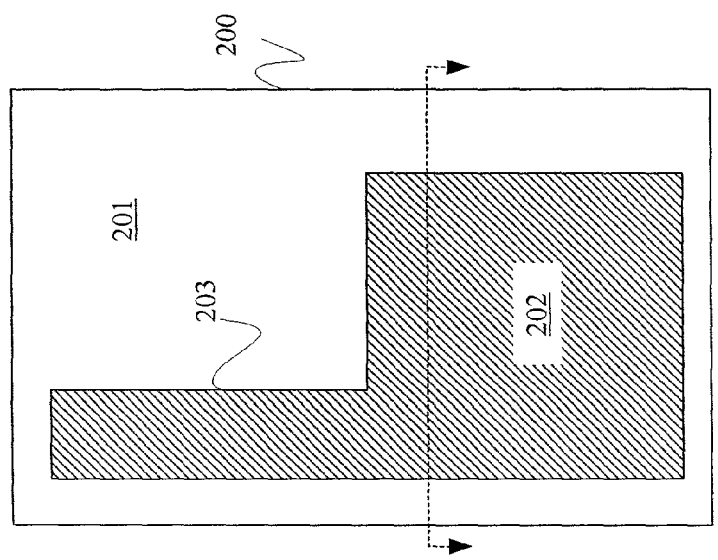
FIGS. 2(a)–(b) illustrate a planar view and a cross section view of a feature on an attenuated phase-shifting mask, respectively.
Figure 2B:
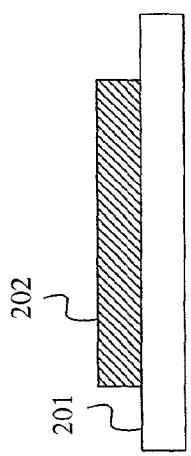

FIG. 2(a) illustrates a simplified, phase-shifting mask 200 fabricated with an attenuated, phase-shifting region 202 formed on a clear region 201, wherein a border 203 of attenuated, phase-shifting region 202 defines a single IC feature. Clear region 201 is transparent, i.e. a region having an optical intensity transmission coefficient T>0.9. In contrast, attenuated phase-shifting region 202 is a partially transparent region, i.e. a region having a low optical intensity transmission coefficient 0.03<T<0.1. Referring to FIG. 2(b), which shows a cross-section of mask 200, the phase shift of light passing through attenuated phase-shifting region 202 relative to light passing through clear region 201 is approximately 180 degrees.

Increasing the intensity transmission coefficient of attenuated phase-shifting region 202 could increase the performance of structures formed by the photolithographic process. In fact, optimal performance would be theoretically achieved by providing an attenuated, phase-shifting region with an optical intensity transmission coefficient T>0.9 (in other words, the region is transparent) yet having a phase shift of 180 degrees relative to clear region 201. In this manner, assuming partially coherent illumination, amplitude side lobes from each region would substantially cancel, thereby creating a substantially zero-intensity line at the transition between these two regions. Current material technology typically provides this phase shift with an attenuated, phase-shifting region having an optical intensity transmission coefficient of approximately T=0.4, although providing a higher transmission is theoretically possible.

The use of this higher transmission phase-shifting material can increase the risk of printing certain portions of attenuated phase-shifting region 202. Specifically, to ensure complete removal of residual resist, the actual dose used to remove the resist is typically at least twice the theoretical dose needed to remove the resist. This over-exposure can result in increasing the risk of printing certain larger portions of attenuated phase-shifting region 202. Therefore, some masks, called tri-tone attenuated phase-shifting masks, include an opaque region within the larger portion(s) of the attenuated, phase-shifting region, wherein the opaque region blocks any unwanted light transmitted by the attenuated phase-shifting region.

Figure 2C:
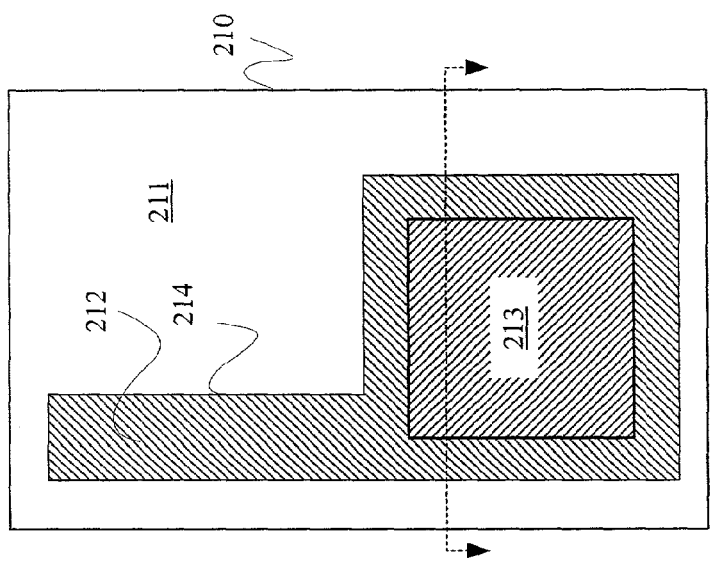
FIGS. 2(c)–(d) illustrate a planar view and a cross section view of a feature on a tri-tone attenuated phase-shifting mask, respectively.
Figure 2D:
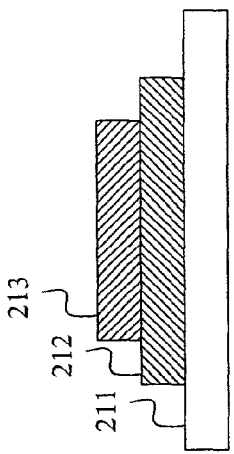

FIG. 2(c) illustrates a simplified, phase-shifting mask 210 fabricated with an attenuated phase-shifting region 212 formed on a clear region 211 and an opaque region 213 formed on attenuated phase-shifting region 212, wherein a border 214 of attenuated phase-shifting region 212 defines a single IC feature. In this embodiment, clear region 211 has an optical intensity transmission coefficient T>0.9, attenuated phase-shifting region 212 has an optical intensity transmission coefficient 0.03<T<0.4, and an opaque region 213 typically has an intensity transmission coefficient of T<0.01. Referring to FIG. 2(d), which shows a cross-section of mask 210, the phase shift of light passing through attenuated phase-shifting region 212 relative to light passing through clear region 211 remains approximately 180 degrees. Thus, forming an opaque region on an attenuated phase-shifting region advantageously allows for the use of a significantly higher optical intensity transmission coefficient.

In yet another type of PSM mask, called an alternating PSM mask, apertures between closely spaced features are processed so that light passing through any aperture is 180 degrees out of phase from the light passing through an adjacent aperture. FIG. 2(e) illustrates one embodiment of an alternating PSM mask 220 including closely spaced opaque features 222, 223, 224, and 225 formed on a transparent substrate 221. In this manner, apertures 228, 229, and 230 are formed between features 222, 223, 224, and 225, as shown in FIG. 2(f). Shifters 226 and 227 are provided to shift the phase of the light transmitted by apertures 228 and 230 by 180 degrees compared to the phase of light transmitted by aperture 229.

In another embodiment of an alternating PSM mask, the phase-shifters are eliminated, and instead, the quartz under alternating apertures can be etched, thereby causing the desired 180 degree phase shift. FIG. 2(g) illustrates one embodiment of an alternating PSM mask 240 including closely spaced opaque features 242, 243, 244, and 245 formed on a transparent substrate 241. In this manner, apertures 246, 247, and 248 are formed between features 242, 243, 244, and 245. Substrate 241 is subsequently etched in the area defined by aperture 247 to a predetermined depth. In this manner, the phase shift of light passing through aperture 247 relative to light passing through apertures 246 and 248 is approximately 180 degrees.

To yet further decrease feature size while maintaining resolution, some systems use shorter wavelengths of light. However, few optical exposure wavelengths exist below 157 nm. Specifically, wavelengths shorter than 157 nm are absorbed, not refracted, by the conventional quartz lens used in optical lithography. Thus, no image can be formed using these wavelengths and conventional optical lithography.

Figure 3A:
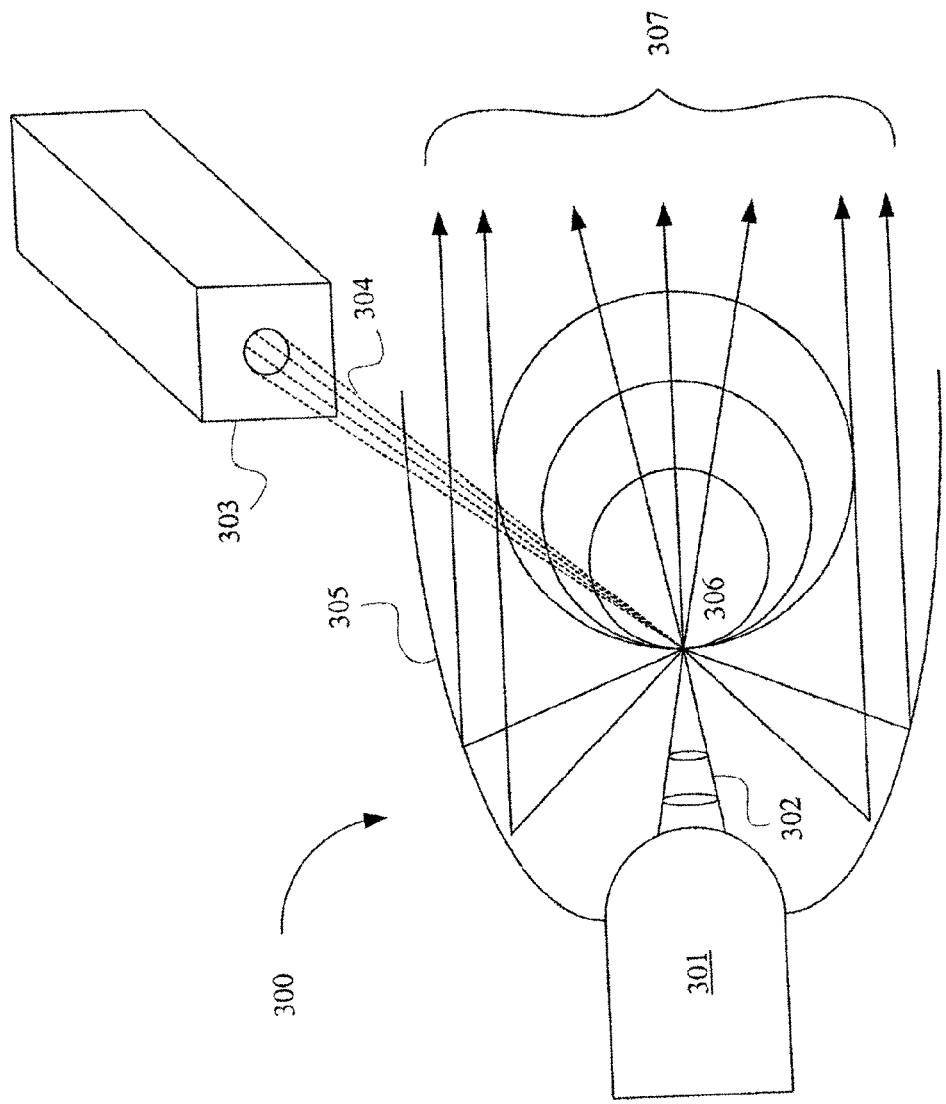
FIG. 3(a) illustrates a source system for generating radiation that can be used in EUV lithography.

Therefore, next generation lithography (NGL) technologies are currently being developed that solve this absorption problem. One NGL technology showing potential is extreme ultraviolet (EUV) lithography using effective wavelengths between 11 and 14 nm. FIG. 3(a) illustrates a system 300 that can produce this range of wavelengths. In system 300, a supersonic gas jet 301 generates a gas stream 302. A laser 303 generates a pulsed laser beam 304 that bombards gas stream 302, thereby creating a point plasma source 306 that can emit photon energy 307. Condenser optics 305 can direct this photon energy 307 at a EUV mask.

Figure 3B:
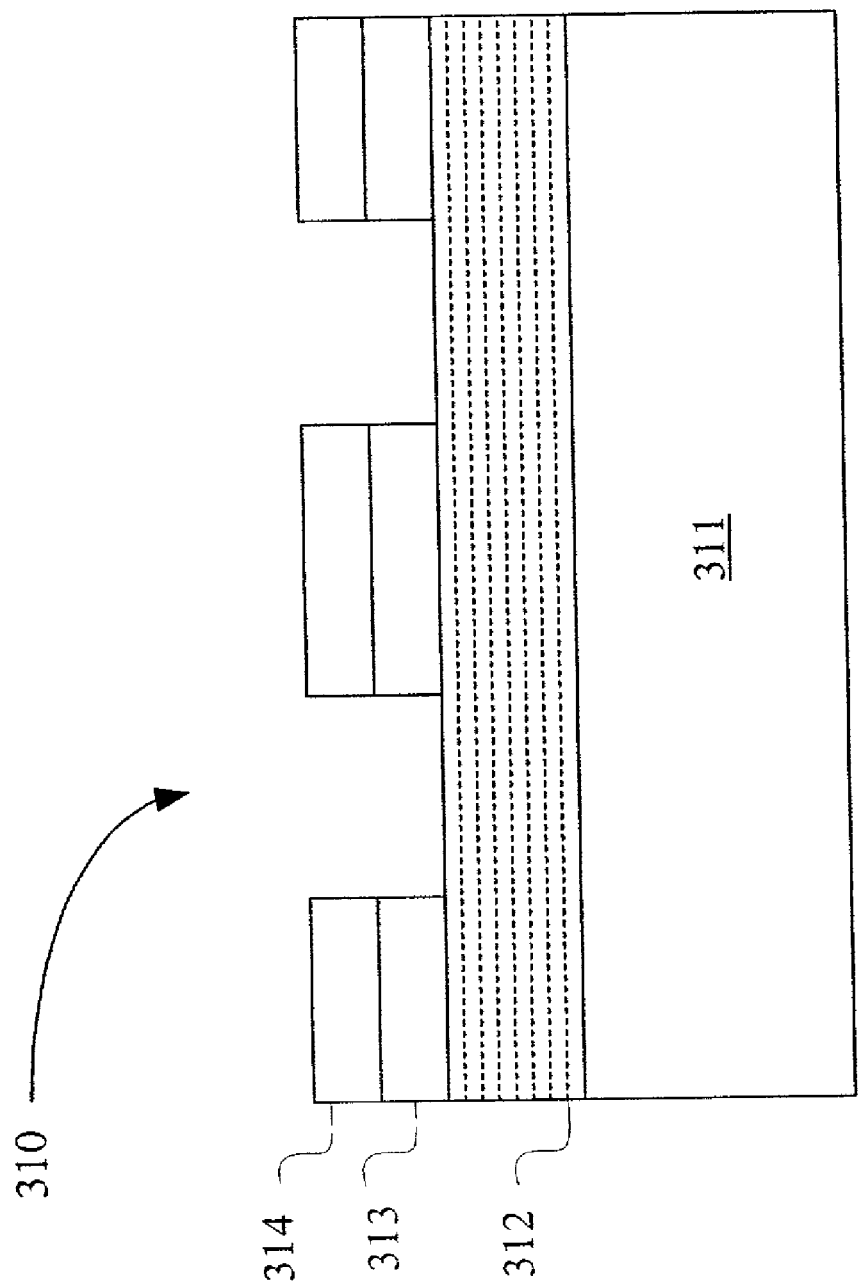
FIG. 3(b) illustrates a EUV mask having a reflective stack for focusing and reflecting radiation.

FIG. 3(b) illustrates an exemplary EUV mask 310 used to pattern a wafer using the photon energy generated by system 300. EUV mask 310 typically includes a substrate 311 on which are formed a reflective stack 312, a patterned silicon dioxide layer 313, and a plurality of patterned absorbers 314. Substrate 311 is merely provided for support and can be fabricated from silicon dioxide, silicon, glass, or other low thermal expansion materials. A silicon dioxide layer is provided to protect reflective stack 312 during the etching of patterned absorbers 314. A subsequent etch is performed to remove portions of this silicon dioxide layer in a self-aligned process, thereby forming patterned silicon dioxide layer 313 and exposing portions of reflective stack 312. In one embodiment, reflective stack 312 can include 40 multi-layer pairs of molybdenum (Mo) and silicon (for reflecting 13.4 nm radiation) or Be and silicon (for reflecting 11.8 nm radiation). Reflective stack 312 can be used to filter and reflect the desired wavelength. Patterned absorbers 314, which define the circuit pattern to be transferred to the wafer, can be fabricated using opaque (imaging) material, such as tungsten (W), titanium (Ti), titanium nitride (TiN), tantalum nitride (TaN), germanium (Ge), chromium (Cr), or aluminum (Al).

Figure 3C:
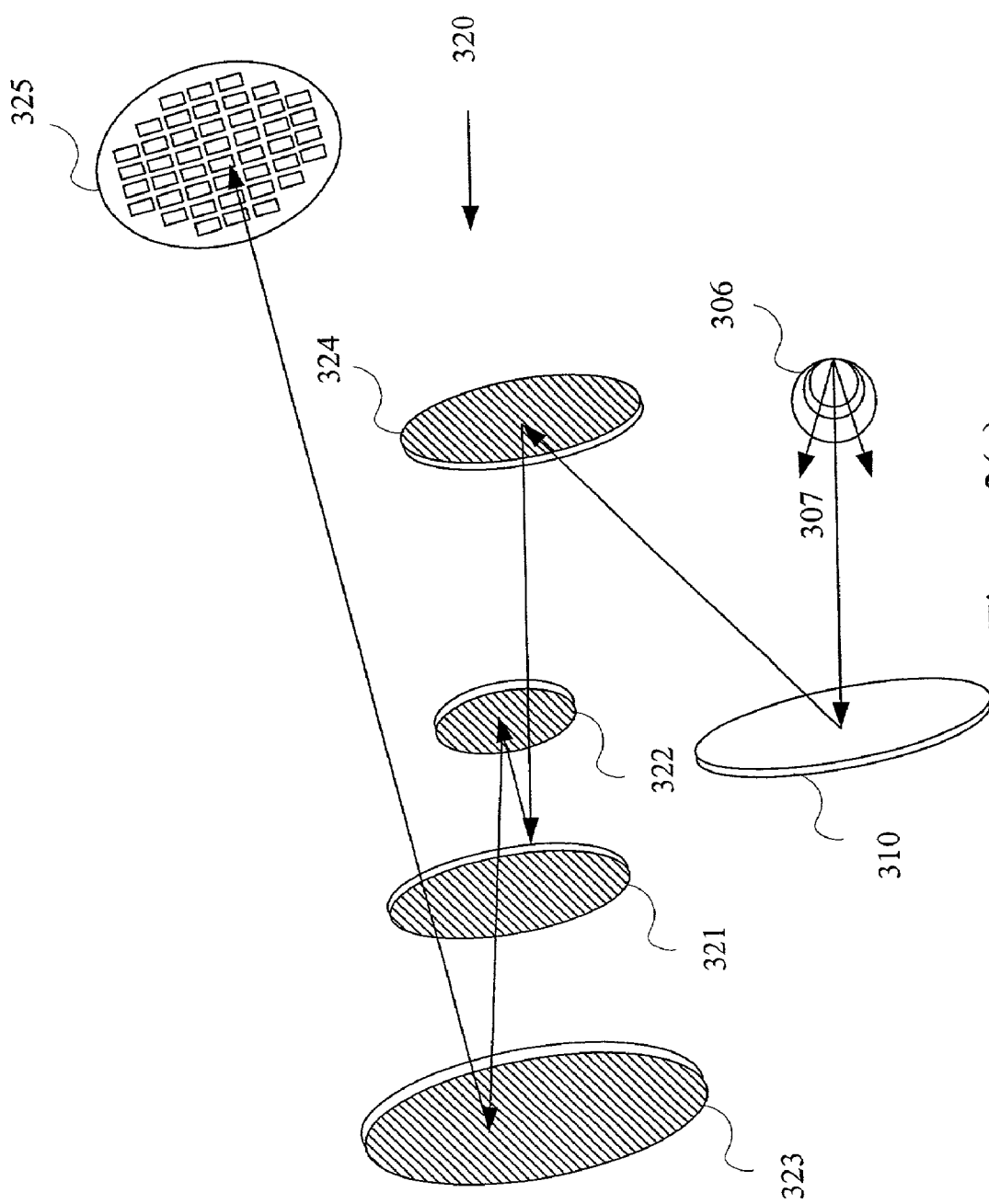
FIG. 3(c) illustrates a EUV optics system positioned to focus the reflected radiation from a EUV mask onto a wafer.

FIG. 3(c) illustrates a EUV optics system 320 positioned relative to point plasma source 306, directed photon energy 307, and EUV mask 310. EUV optics system 320 includes a plurality of mirrors for focusing the electromagnetic radiation reflected from EUV mask 310. Specifically, in one embodiment, radiation reflected from EUV mask 310 is focused using concave mirrors 323 and 324 as well as convex mirrors 321 and 322. Mirrors 321–324 are typically formed on ceramic-polished aspheric surfaces coated with multi-layer metal pair stacks (e.g. similar to reflective stack 312 in FIG. 3(b)). The metal composition of the stacks determines the resulting wavelength of the focused radiation. In one embodiment, EUV optics system 320 is a 4× reduction system that focuses the radiation onto a wafer 325. Note that other embodiments can include fewer or more mirrors to provide the desired focusing; however, each mirror surface should provide at least 60% reflectivity. EUV optics system 320 further includes standard step-and-scan technology and associated devices (not shown) that coordinate the movement of EUV mask 310 and wafer 325 (for example, in a 4× reduction system, EUV mask 310 moves four times faster than wafer 325) during the exposure process.

The present invention takes into account printability without the need for the expensive steps of actually exposing a wafer. The present invention is capable of using a captured image of a mask and certain metrology data to simulate the wafer exposure that the mask would provide under a given set of stepper conditions. Specifically, after an initial mask inspection for defects has been performed, potential defects have been identified, and data such as phase, transmission, and/or reflectivity have been determined, the present invention can be used to simulate the wafer exposure. In this way, the printability of potential defects can be directly analyzed without taking the expense of an actual wafer exposure.

Further, the simulation can be controlled to take into account any number of parameters associated with the lithographic process, thereby making the printability determination process specific. Still further, the simulation of each defect can be performed at numerous values of certain process variables that might vary during actual exposure (such as defocus) in order to determine the effect the potential defects have on the wafer manufacturing process window. Subsequent processing can also be modeled with accuracy and with little loss of speed by calibrating the process to take into account the photoresist process and etching process parameters.

Figure 4:
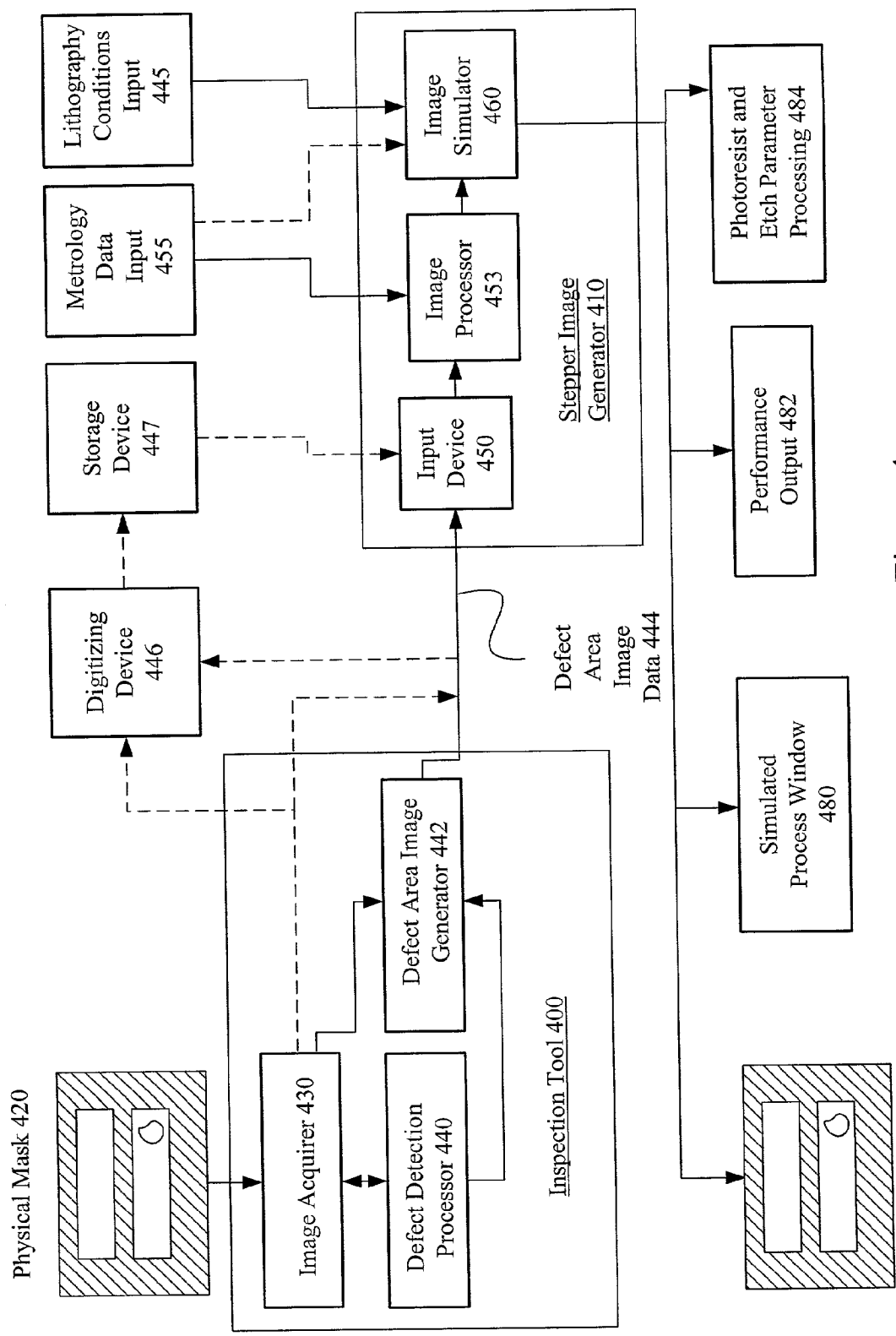
FIG. 4 illustrates a process of analyzing a photolithography mask for defects in accordance with one embodiment of the present invention.

A detailed description of preferred embodiments is provided with respect to the figures in which FIG. 4 illustrates, in simplified process flow diagram form, a process of analyzing a mask for defects in accordance with one embodiment of the present invention. The process utilizes an inspection tool 400 and a stepper image generator 410. The inspection tool 400 may comprise an image acquirer 430, a defect detection processor 440, and a defect area image generator 442. In one embodiment, the inspection tool 400 may be all-inclusive in that it contains each of the aforementioned elements in one package. This all-inclusive tool 400 setup is typically used in on-line mask inspection. In another embodiment, the tool 400 may comprise a number of separately existing elements which interface with each other as is typically used in off-line mask inspection. For example, in one embodiment, the image acquirer 430 is a separate device from the defect detection processor 440.

The image acquirer 430 may comprise a high-resolution imaging device such as a high resolution optical microscope, a scanning electron microscope (SEM), a focus ion beam, an atomic force microscope, or a near-field optical microscope, all of which are well known in the art of mask inspection. The image acquirer 430 may also comprise a device such as a CCD camera capable of interfacing with the particular type of microscope used and digitizing the image information from the microscope. For instance, a CCD camera that creates n-bit gray scale image data that is representative of the image from the microscope may be used. The image data may be stored in a format such as Windows BMP on any type of appropriate media including a computer hard disk drive, a CDROM, and a server. The image acquirer 430 can scan all or a portion of the mask 420.

The defect detection processor 440 controls the image acquirer 430. In one embodiment, the defect detection processor 440 provides control signals that control the manner in which the image acquirer 430 scans the mask. Further, the defect detection processor 440 compares the mask images provided by the image acquirer 430 to a set of potential defect criteria and determines what areas of the mask contain potential defects. In one embodiment, the defect detection processor 440 comprises a computer running a program of instructions and interfacing with the image acquirer 430 such that the scanning of the mask is done in the desired manner. In one embodiment, the program operates such that a user may change the parameters of the scanning performed on the mask 420. In another embodiment, the image acquirer 430 could be replaced with a preexisting image of a mask or a portion of a mask. Any representation of the physical mask 420 that is capable of being analyzed by the defect detection processor 440 is acceptable as an input.

The defect detection processor 440 also controls the defect area image generator 442 that provides images of those areas of the mask 420 which may contain defects. For instance, as the image acquirer 430 provides image input scanned from the mask 420 to the defect detection processor 440, the defect detection processor 440 determines whether that portion of the mask scanned contains any potential defect areas based on predetermined defect criteria. In one embodiment, these criteria can be changed by a system user. If a potential defect is discovered, the defect processor 440 signals the defect area image generator 442 to provide a defect area image of the area surrounding the potential defect. The defect area image generator 442 thus provides defect area image data 444. In one embodiment, the defect area image generator 442 can be a part of the image acquirer 430 and the defect area image generator 442 can comprise the CCD camera of the image acquirer 430. In another embodiment, the defect area image generator 442 can be a separate device, which receives image input from the image acquirer 430.

The embodiments of the inspection tool 400 may be utilized to provide data for the stepper image generator 410 in a number of ways. First the image acquirer 430 could scan the entire mask 420 or a portion of the mask 420 without any control from the defect detection processor 440 and store the resulting image data in a storage device 447 (such as a server) after digitizing the data with a digitizing device 446 (such as an image grabber). This same image data could also be provided directly to the stepper image generator 410 via a real time data feed. Second, in the case of the image acquirer 430 being under the control of the defect detection processor 440, the defect area image generator 442 may provide the defect area image data 444 either directly to the image generator 410 via a real time data feed (on-line inspection) or provide the image data 444 to the digitizing device 446 and then to the storage device 447 for later off-line inspection.

The stepper image generator 410 comprises an input device 450 and an image simulator 460. The input device 450, in the case of stored image data from the storage device 447, may comprise any hardware suitable for reading the type of media upon which the image data is stored, including a computer hard disk drive, a CDROM reader, and a personal computer attached to a server via a network, among others. In the case of a real time feed of image data from the defect area image generator 442 or image acquirer 430, the input device may comprise a digitizing device, such as an image grabber. For instance, in one embodiment the input device may comprise an 8-bit frame grabber device such as those that are known in the art including the Matrox™ Meteor™ and Pulsar™. The input device 450 also receives other input data such as lithography conditions input 445. In one embodiment, the image simulator 460 comprises a computer implemented program which accepts the stored image data or real time feed from the input device 450, and produces a simulated stepper image 470 for the physical mask 420. In this computer-implemented embodiment, the image simulator 460 program may be run on a variety of computer platforms including: a PC using the Windows 95™ or NT™. 4.0 operating system with 128 MB of RAM and a 200 MHz Pentium Pro™ microprocessor, either stand alone or connected to a network, and a SUN™ workstation computer among others. In some cases, the amount of time required for one embodiment of the image simulator 460 to simulate an image of conventional CCD array size is less than a second.

In one embodiment, the inspection tool 400 and the stepper image generator 410 operate to produce a simulated stepper image 470, a simulated process window 480 output for a physical mask 420, and/or other performance related output used to characterize, define, or measure the effect of a defect(s) on integrated circuit performance as follows. The physical mask 420 is inspected by the inspection tool 400. Specifically, the inspection acquirer 430 scans the physical mask 420 for possible defects and the defect area image generator 442, pursuant to direction from the defect detection processor 440, generates defect area image data 444 of those areas of the mask containing possible defects. The defect area image data 444 is then either fed to the input device 450 in real time, and/or stored in the storage device 447 via the digitizing device 446 for later inspection. The input device 450 receives the defect area image data 444 from the defect area image generator 442 or the storage device 447.

In accordance with one feature of the present invention, the input device 450 provides the defect area image to an image processor 453 that can identify the intensity transitions of the defect area image. For example, if the image processor 453 identifies two intensities in the defect area image, then a transition between these two intensities defines an edge of a feature in the defect area image.

In one embodiment, the image processor 453 can also receive metrology data input 455 to more accurately interpret the intensity transition information. Specifically, the metrology data input 455 can include data related to the physical mask 420. For example, if the physical mask 420 is an attenuated PSM mask (see FIGS. 2(a) and 2(b)) or a tri-tone attenuated PSM mask (see FIGS. 2(c) and 2(d)), then the metrology data input 455 can include certain data, such as the phase and the transmission, associated with the features on the physical mask 420. In yet another example, if the physical mask 420 is a EUV mask (see FIG. 3(*b*)), then the metrology data input 455 can include certain data, such as the reflectivity of the reflective stack.

For example, if the metrology data input 455 indicates that the physical mask 420 is a tri-tone attenuating mask, then an area identified as having an intensity of approximately 0.8 can be interpreted by image processor 453 as a clear area with an associated transmission of 1.0 and a phase of 0 degrees, an area identified as having an intensity of approximately 0.5 can be interpreted as an attenuating area with an associated transmission of 0.035 and a phase shift of 180 degrees, and an area identified as having an intensity of approximately 0.1 can be interpreted as the opaque area with a transmission of 0.0. In other words, in one embodiment, the metrology data input 455 can merely include specification data relating to the physical mask 420. In another embodiment, the inspection tool 400 can provide additional, measured information regarding the physical mask 420, thereby allowing the image processor 453 to determine the actual phase and transmission of the attenuated/clear/opaque areas in the defect area image. In either embodiment, once receiving the metrology data input 455 and the information provided by the inspection tool 400, the image processor 453 can assign both phase and transmission data to each area within the defect area image.

Note that in an alternative embodiment, the image processor 453 can simply identify the intensity transitions. In this embodiment, an image simulator 460 can receive both the intensity transition information from the image processor 453 as well as the metrology data input 455. Thus, the image simulator 460 can, in addition to providing the functionality described below, interpret the intensity transition information, i.e. identify the phase and transmission for each area on the defect area image. In either embodiment, the metrology data input 455 can significantly increase the accuracy of the simulations generated by the image simulator 460 for nonstandard photolithographic masks, such as PSM or NGL masks.

Further note that the inspection tool 400 can introduce some distortion into the defect area image data 444. Specifically, depending on the technology used by the image acquirer 430, the phase-shifting or NGL aspects of the physical mask 420 may cause the captured features in the defect area image to be different, e.g. smaller, than the actual feature in the physical mask 420. In one embodiment, the image processor 453 or the image simulator 460 can compensate for this distortion.

The image simulator 460 also can receive lithography conditions input 445. The lithography conditions input 445 contains data that is specific to the lithography conditions and system parameters under which the physical mask 420 is to be later exposed if it passes inspection. This data may include parameters such as the numerical aperture of the system (NA), the coherency value of the system (σ), the wavelength of the illumination being used in the system (λ), the defocus of the exposure, lens aberrations, substrate conditions and the critical dimensions of the design among others. Further, the lithography conditions input 445 may contain a range of these parameters such that the simulation can be performed a number of times for different combinations of these parameters. In this manner, the printability of a mask defect can be analyzed over a range of possible lithography conditions, and the effect of a potential mask defect on the process window can also be analyzed.

In one embodiment, the image simulator 460 receives the defect area image data 444 from the input device 450, the lithography conditions input 445, and the metrology data input 455 and generates a simulated stepper image 470 which is a simulation of the wafer exposure which the defect area of the physical mask 420 would generate if an exposure had been performed under the same conditions as the lithography conditions input 445 and using a mask having the parameters as provided in the metrology data input 455. Similarly, the image simulator 460 can generate a simulated process window 480, which represents the effect the potential defect area has on the process window, and/or a performance output 482 as discussed above. Furthermore, in one embodiment, the image simulator 460 is able to generate a simulated stepper image 470 for a potential defect area of a mask of a number of different types of mask design including bright field and dark field. The simulated stepper image 470, the simulated process window 480, and/or the performance output 482 may then be inspected to determine the printability of any identified potential defect area without actually taking the expense of exposing a real wafer with the mask, as will be explained in more detail with respect to FIGS. 8–11. Finally, in other embodiments, the image simulator 460 could take into account the parameters associated with the photoresist material to be used and/or the etching process to be used on the exposed wafer in order to simulate the end result of these processes as shown by block 484 and discussed more fully below with respect to FIG. 6.

FIGS. 5(*a*) and 5(*b*) illustrate in process flow diagram form, two embodiments of the image simulation process utilized in the present invention to produce simulated stepper images of an exposed wafer. FIG. 5(*a*) illustrates an embodiment of the process as it would be used on a design mask such as by the design image simulator 960 to be described below with respect to FIG. 9. FIG. 5(*b*) illustrates an embodiment of the process as it would be used on a captured image of a physical mask such as by the image simulator 460 of FIG. 4, the image simulators 830 and 860 of FIG. 8, and the mask image simulator 950 and design image simulator 960 of FIG. 9. Prior to discussing the specifics of FIGS. 5(*a*)–(*b*) however, it would be beneficial to describe some of the background behind the simulation processes illustrated therein.

In overview, the simulation process as described with respect to FIGS. 5(*a*)–(*b*) makes use of what is referred to in the art as the Hopkins model in order to approximate the process of optical lithography as well as some types of NGL lithography, such as EUV lithography. According to the Hopkins model, in a sufficiently general setting, the imaging process may be described by the following nonlinear integral equation:

$$I(x, y) = |g(x, y)|^2 \tag{1}$$
$$= [T(f)](x, y)$$
$$= \int R^4 f(\xi_1, \xi_2) J_0(\xi_1, \xi_2, \eta_1, \eta_2) f * (\eta_1, \eta_2)$$
$$= K(x, y, \xi_1, \xi_2,) K * (x, y, \eta_1, \eta_2) d\xi_1 d\xi_2 d\eta_1 d\eta_2$$

where,
I(.) is the intensity image at the image plane;
g(.) is the amplitude image at the image plane;
f(.) is the object being imaged (mask);
K(.) is the coherent point spread function, which describes properties of the lithography system;
$J_0$(.) is the mutual intensity function, which describes coherence properties of the illumination.

Figure 5A:
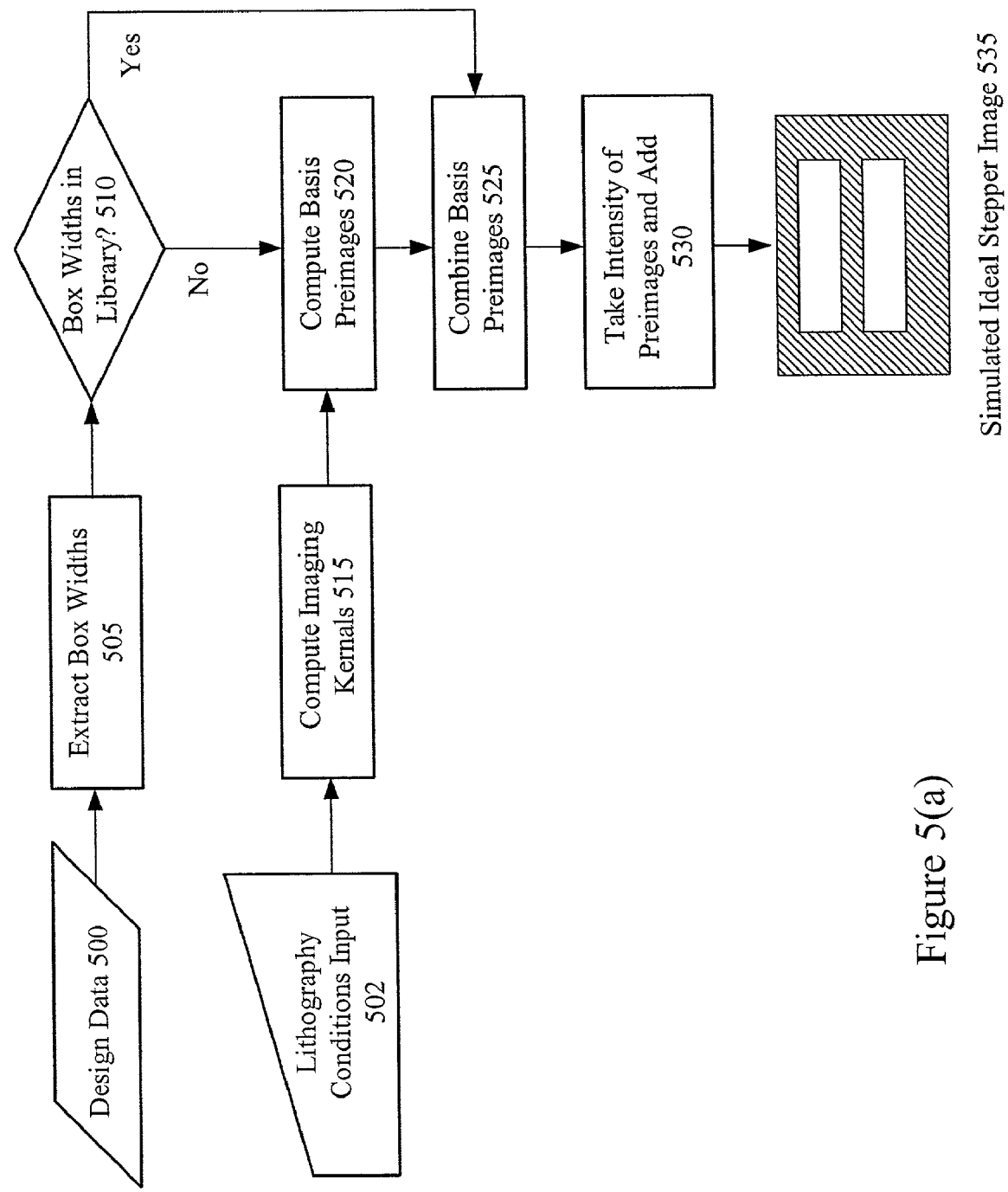
FIGS. 5(a)–(b) illustrate two methods of utilizing one embodiment of the present invention to produce simulated stepper images of an exposed wafer.
Figure 5B:
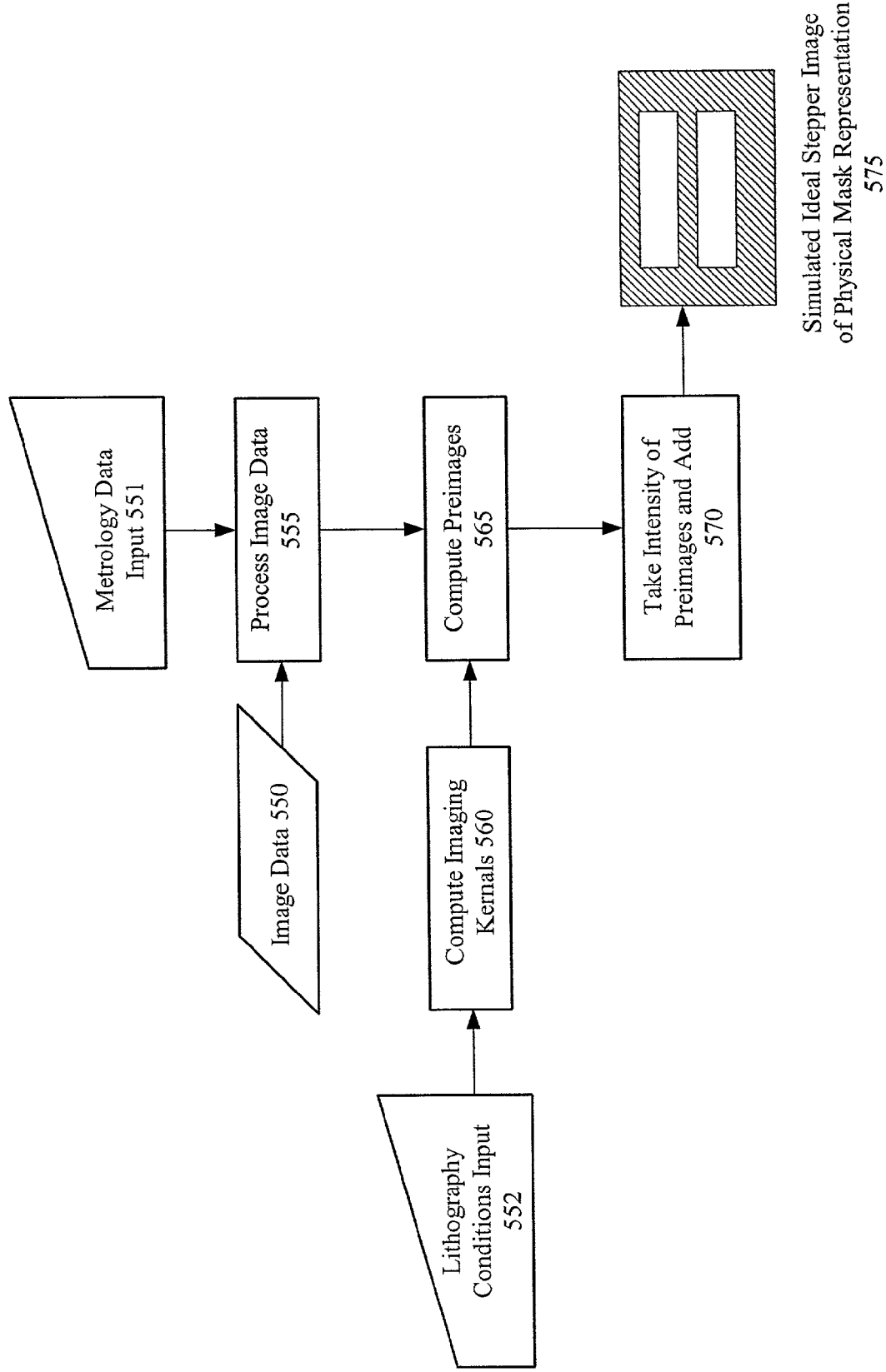

However, the above nonlinear integral equation is far too complex to be applied efficiently to realistic integrated circuit patterns. Thus, the image simulations to be discussed with respect to FIGS. 5(a)–(b) are, in one embodiment, produced using a process that is a simplified approximation of the Hopkins model as applied specifically to integrated circuits. In this process, the Hopkins model is first effectively broken down into a number of low pass filters that are applied to the input data. The resulting images are then added to generate the simulated image. The basic premise of this Hopkins model approximation is contained in Y. C. Pati et al., "Phase-shifting masks for microlithography: automated design and mask requirements", JOURNAL OF THE OPTICAL SOCIETY OF AMERICA, Vol. 11, No. 9, pp. 2438–52, (September 1994), which is incorporated herein by reference as if set forth fully, and in Y. C. Pati et al., "Exploiting Structure in Fast Aerial Image Computation for Integrated Circuit Patterns", IEEE TRANSACTIONS ON SEMICONDUCTOR CIRCUIT MANUFACTURING, Vol. 10, No. 1, pp. 6274, (February 1997) (hereinafter Pati et al.), which is also incorporated by reference herein as if set forth fully.

The method referenced above is known as "Optimal Coherent Approximations" (OCAs) or "Optimal Coherent Decompositions" (OCDs). This method makes use of a structure that can be extracted from the partially coherent Hopkins model in order to simplify the equation on a first order. The first order simplification obtained through OCA utilizes the fact that in the special case where illumination is completely coherent, the Hopkins model simplifies to:

$$I(x,y)=|(f*K)|^2 \qquad (2)$$

where "*" denotes the 2-D convolution operator, $$(p*q)(x,y)=\int\int p(\xi_1,\xi_2)q(x-\xi_1,y-\xi_2))d\xi_1 d\xi_2. \qquad (3)$$

Thus, in the coherent case the computation required to compute the image reduces to $O(N \log_2 N)$, using the Fast Fourier transform (FFT), where N is the number of discrete sample points considered. This fact, combined with the utilization of an integrated circuit's inherent structure to drastically reduce the number of computations $<<O(N \log_2 N)$, as described in Pati et al. at 63–65, motivated the use of OCAs which approximate the intensity of the image of a partially coherent optical system as a finite incoherent sum of coherent images such that:

$$I(x,y)=|g(x,y)|^2 \approx \text{for } k=1 \text{to } m \Sigma \alpha_k |(f*\phi_k)(x)|^2 \qquad (4)$$

where the $\alpha_k$'s and the imaging kernels $\phi_k$'s are determined from the illumination mutual intensity function $j_0$ and the coherent point spread function K, and assuming spatial invariance of the imaging system being approximated (each $f*\phi_k$ convolution will be referred to hereinafter as a preimage).

From equation 4, note that the accuracy of the OCA method is dependent upon the number m of coherent images summed. For imaging systems with coherency factors $(\sigma) \leq 0.5$—which is in the range of coherency factors sometimes employed in optical lithography—it has been demonstrated that only five or six kernels $\phi_k$, and therefore only five or six coherent preimages, are required to provide an acceptable approximation. Therefore the OCA method reduces the problem of image computation to one of computing a small number (5 or 6) of 2-D convolutions and summing the resulting preimages. Still other coherency factors ($\sigma$) can be used in optical lithography. For example, $\sigma=0.9$ may be used. Also, $\sigma=0.5$ is sometimes used for contacts and $0.6 \leq \sigma \leq 0.7$ is sometimes used for line/space patterns. Note that in EUV systems, a number of coherency factors are being considered including $\sigma \leq 1.0$ as well as $\sigma > 1.0$. Therefore, depending on the coherency factor, more kernels, and thus a few more convolutions, may be required than those used for optical lithography in which $\sigma \leq 0.5$.

The simulation process using OCA as described above is described below with respect to FIG. 5(a) as it would be used on a design mask, which in one embodiment is described by a GDS-II data file. As described fully in Pati et al. at 65–69, the computations required for a simulation of a design mask may be simplified to a second order by exploiting the geometrically primitive structures of the integrated circuit. This exploitation of the integrated circuit structure is generally accomplished by: 1) defining a small set of basis functions that can be used to represent integrated circuit patterns, 2) computing the preimages of the defined basis functions using the imaging kernels, 3) using the preimages of the basis functions as a set of building blocks to construct the preimages of the mask pattern, and 4) combining the preimages to obtain the image of the mask pattern.

Referring then to FIG. 5(a), a data file containing the design data 500 of the mask is provided as an input, and the set of box widths existing in the design is extracted from the design data at block 505. The lithography conditions for the simulation are provided as an input at block 502, from which the imaging kernels $\phi_k$ are computed at block 515 as described above. A determination is then made if basis preimages for all of the extracted box widths have been pre-calculated and exist in a database library at block 510. Basis preimages are then computed at block 520 for those widths whose basis preimages have not been pre-calculated. At block 525, all of the basis preimages are combined, and at block 530 the intensity of each combined preimage is taken and added together to form the simulated ideal design stepper image 535. The details of the calculations performed at each block are found in Pati et al. at 65–69. Of note here is that for the design mask simulation, in computing each of the basis preimages at block 520, the full convolution of equation 4 is not performed. Instead, use is made of the knowledge of the spatial bandwidth of the chosen basis functions such that the convolution need only be computed in the spatial domain at a number of desired sample widths.

The simulation process using OCA as described above is described below with respect to FIG. 5(b) as it would be used on a captured image of a physical mask such as by the image simulator 460 of FIG. 4 and the mask image simulator 950 of FIG. 9. The embodiment of the process described below is substantially different than the one described above with respect to FIG. 5(a) in part because of the form of the input data file. The input image data 550, which comprises digitized image data that in one embodiment is an 8-bit gray scale image file in a format such as Windows BNP, is provided to block 555. The metrology input data 551 regarding the physical mask is also provided to block 555. Both the image data 550 and the metrology data input 551 are then processed at block 555 to increase the sensitivity of the overall process and to produce a data file whose image is closer to what a mask actually looks like. This is done because of the numerous (256) intensities that may exist in an 8-bit image file taken from a microscope when, in reality, the actual mask has only two intensities, dark or clear. Thus in one embodiment, the processing at block 555 may comprise a multiple threshold process in which the 256 possible intensity levels of the 8-bit file are folded into 4 or 6 levels. Alternatively, the processing at block 555 could comprise a type of non-linear filtering to increase the process sensitivity such as taking the logarithm of the image intensity, which would enhance the lower intensities.

The lithography conditions for the simulation are provided as an input at block 552, from which the imaging kernels ϕhd k computed at block 560 as described previously. Using the processed image data from block 555 and the imaging kernels $\phi_k$ input, the preimages of the wafer image are computed at block 565, and at block 570 the intensity of each preimage is taken and added together to form the simulated stepper image of the physical mask representation 575 in accordance with equation 4.

Note that since the mask function $f$ is defined entirely by pixel data, there is no spatial structure that can be taken advantage of as with a design mask. However, since each pixel is of the same size, the step of block 525 of FIG. 5(a) can be avoided since there is only one basis pre-image to be calculated for each of the imaging kernels $\phi_k$. The computation of preimages at block 565 also differs from its corresponding block 520 of FIG. 5(a). Specifically, there is no preexisting knowledge from which one could limit the convolution to only a small number of sample points and still get an accurate approximation of the pre-image. Thus, the full convolution of equation 4 needs to be performed using the mask function $f$—which consists of processed pixel data—to approximate each preimage and therefore the final mask image accurately. A straight convolution in the spatial domain would result in an enormous amount of data, and large amounts of processing time for each preimage. This embodiment of the invention solves these problems by performing each convolution in the time domain using a Fast Fourier Transform (FFT) on equation 4 in order to compute each pre-image. Thus, by taking the FFT of both $f$ and $\phi_k$, the value of the kth pre-image can more easily be solved as shown below, where $I(X,Y)_k$ is equal to the kth preimage:

$$\text{Because } I(X,Y)_k \propto (f * \phi_k) \quad (5)$$

$$\text{Then } F(I_k) \propto F(f) \cdot F(\phi_k) \quad (6)$$

Although an FFT is used in one embodiment of the invention, any transformation could be used to remove the convolution from the spatial domain and perform the underlying pre-image calculations of equation 4.

Figure 6A:
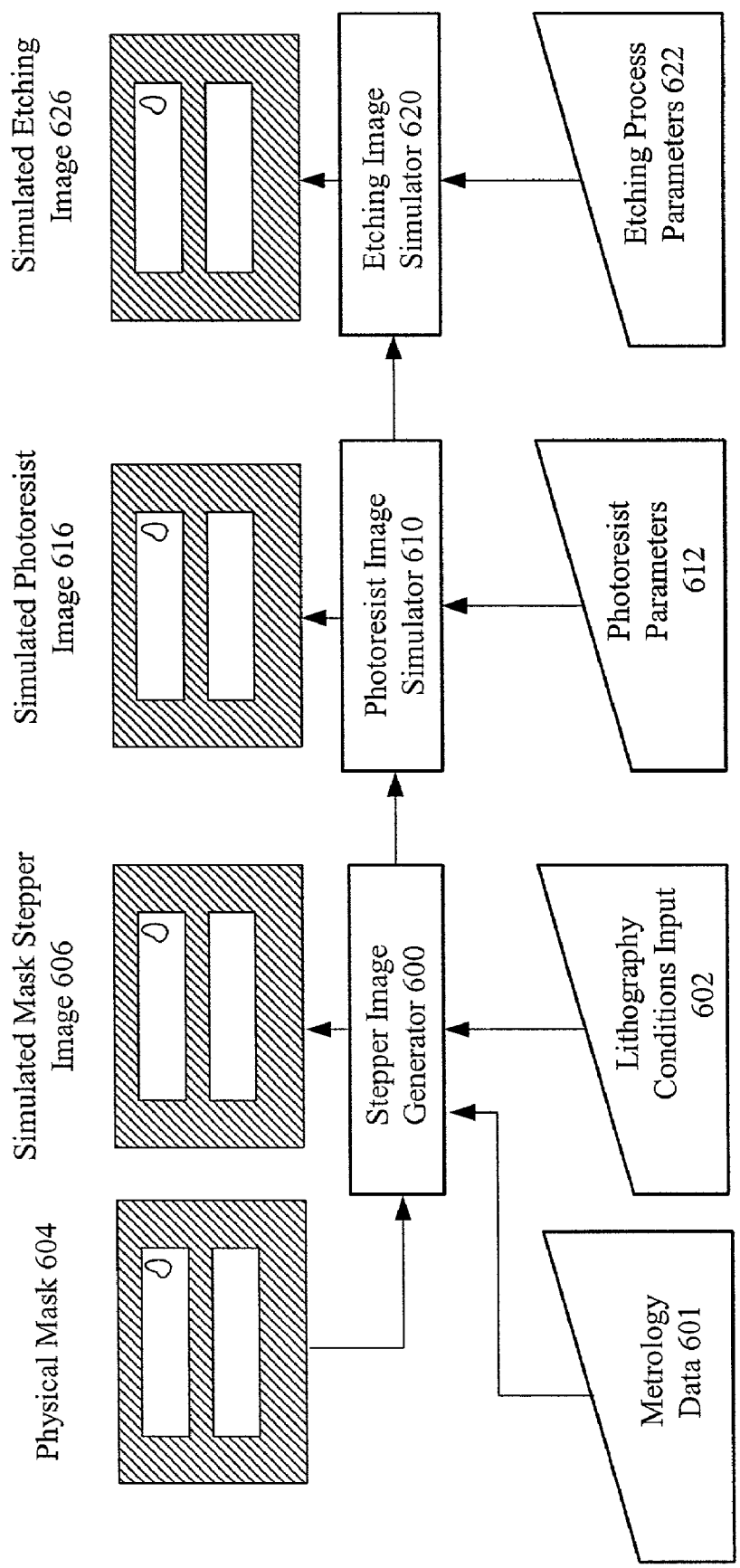
FIGS. 6(a)–(b) illustrate two methods of utilizing one embodiment of the present invention to generate image simulations, which incorporate photoresist material parameters and etching parameters.
Figure 6B:
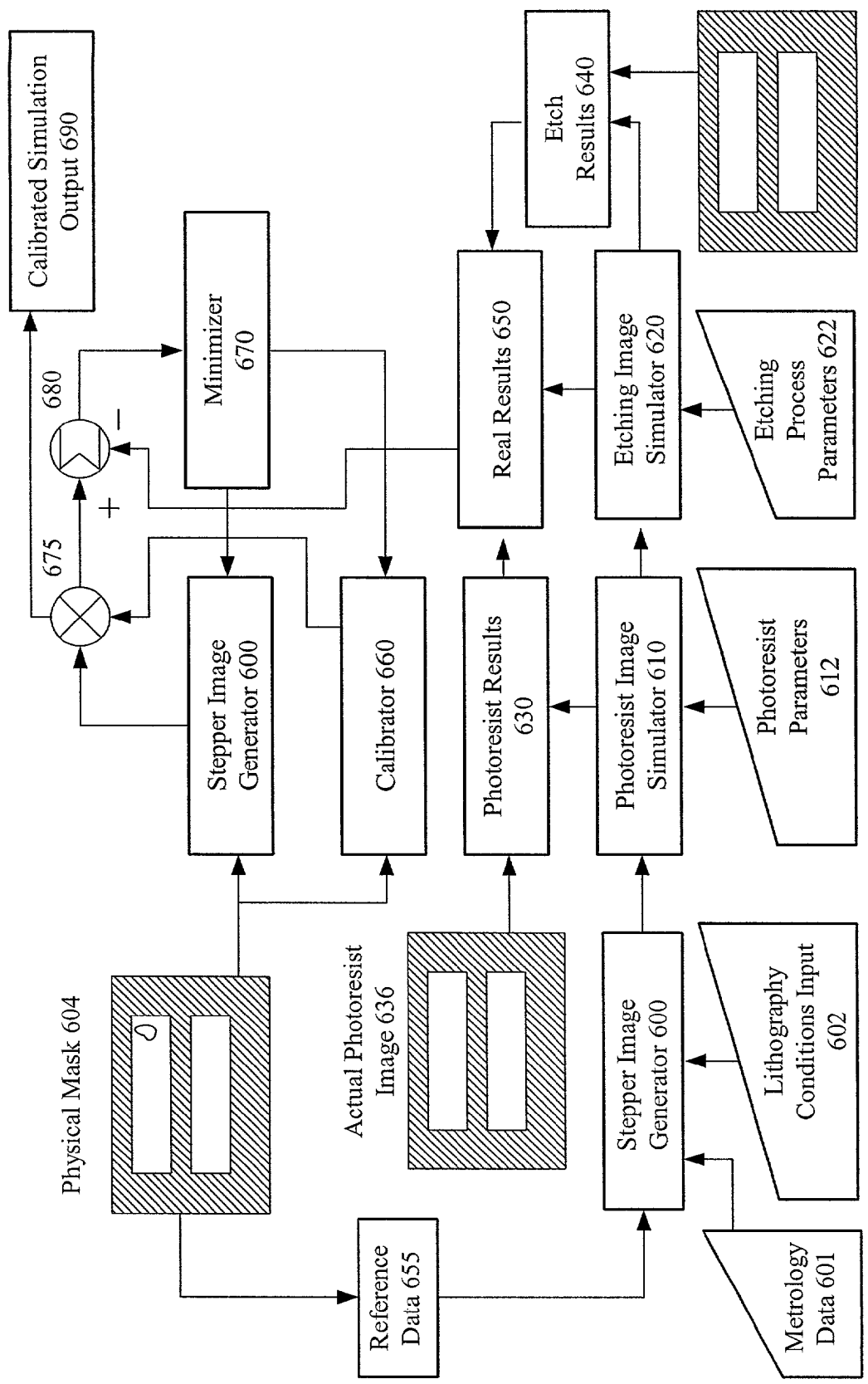

As noted previously with respect to FIG. 4, the image simulation process of the present invention may, in alternate embodiments, take into account the parameters associated with the photoresist material to be used and/or the etching process to be used on the exposed wafer in order to simulate the end result of these processes. FIGS. 6(a)–6(b) illustrate, in simplified process flow diagram form, two alternate embodiments of the invention which take these parameters into account. For instance, FIG. 6(a) illustrates the use of additional simulation models in conjunction with the lithography simulation discussed above to produce images that take photoresist and/or etching parameters into account. In this embodiment a physical mask 604 to be simulated is provided as an input along with lithography conditions 602 and metrology data 601 to the stepper image generator 600, which produces a simulated mask stepper image 606 in the manner discussed above with respect to FIGS. 4 and 5. Data representing the simulated mask stepper image 606—which may be in the form of image intensity data—is then provided along with photoresist parameters 612 to a photoresist image simulator 610 which in turn produces a simulated photoresist image 616. The simulated photoresist image 616 represents an image of a wafer exposed through the physical mask 604 wherein the wafer was coated with a photoresist material described by the photoresist parameters 612. Data representing the simulated photoresist image 616 may then be provided along with etching process parameters 622 to an etching image simulator 620 which in turn produces a simulated etching image 626. The simulated etching image 626 represents an image transferred on a wafer after the wafer was exposed through the physical mask 604 wherein the wafer was coated with a photoresist material described by the photoresist parameters 612 and then etched in accordance with the etching process parameters 622.

In one embodiment, these photoresist parameters 612 and etching process parameters 622 are able to be changed by a user to match those which will be used in the actual production of a wafer. The photoresist parameters 612 may include thickness, contrast, pre-bake time, post-bake time, development time, photoresist concentration, developer solution concentration, and light absorption of the photoresist among others. The etching process parameters 622 may include etching time, etching method, and concentration among others. In one embodiment of this invention, the photoresist image simulator 610 comprises a computer-implemented program that accepts image data provided by the stepper image generator 600 and produces the simulated photoresist image 616. As before with respect to FIG. 4, the image data may be provided in real time or from a storage device, which has previously stored the simulated mask stepper image data 606. Similarly, in one embodiment of this invention, the etching image simulator 620 comprises a computer-implemented program that accepts image data— either in real time or previously stored—provided by the photoresist image simulator 610 and produces the simulated etching image 626.

In these computer implemented embodiments, the photoresist image simulator 610 and the etching image simulator 620 programs may be run on a variety of computer platforms including: a PC using the Windows 95™ or NT™ 4.0 operating system with 128 MB of RAM and a 200 MHz Pentium Pro™ microprocessor, either stand alone or connected to a network, and a SUN™ workstation computer among others. The photoresist image simulator 610 program described above, may in one embodiment utilize the photoresist model developed by T. A. Brunner and R. A. Ferguson of IBM as set out in "Approximate Models for Resist Processing Effects", SPIE, Vol. 2726, p. 198, which is incorporated herein by reference as if set forth fully. The etching image simulator 620 program described above, may in one embodiment utilize the model developed by TMA as set out in "Accurate Modeling of Deep Submicron Interconnect Technology", TMA TIMES, Vol. IX, No. 3, (Fall 1997) which is incorporated herein by reference as if set forth fully.

FIG. 6(b) illustrates an alternate embodiment in which photoresist or etching parameters can be accounted for in the simulation by calibrating the lithography image simulation discussed previously with respect to FIGS. 4 and 5. In general the process illustrated in FIG. 6(b) comprises calibrating the stepper image generator 600 with the calibrator 660 such that a desired real result 650—for instance, a photoresist image or etching image—is obtained when a physical mask is provided as an input to the system. The process comprises first initializing the system by providing a reference data 655 to the stepper image generator 600 and the calibrator 660. The reference data 655 may comprise any data that is representative of a known mask, such as the design layout data for the mask to be simulated, or an image of a similar mask that has been determined to be free from defects.

The stepper image generator 600 provides an image simulation output to a summing device 675 where it is added to the output of the calibrator 660. The output of the summing device 675 is provided to a difference device 680 along with a real result 650. The desired real result 650 which is provided to the difference device 680 may, in one embodiment, comprise either an etch result 640 or a photoresist result 630, which in one embodiment is chosen by the user. Similarly, the photoresist result may comprise either an actual photoresist image 636 or a simulated photoresist image from a photoresist image simulator 610, which again, may be chosen by the user in one embodiment. The actual photoresist image 636 could be an actual image of a wafer that has been exposed under the photoresist conditions the user wishes to simulate. As discussed above with respect to FIG. 6(*a*), the photoresist image simulator 610 generates a simulation of the image on a photoresist-coated wafer that has been exposed through a mask. In this case the reference data 655 is provided to an un-calibrated stepper image generator 600, which provides its output to the input of the photoresist image simulator 610, which in turn generates a photoresist simulation as discussed above. In this manner a proper comparison can be performed between the real results 650 data and the summing device 675 output.

Similarly, the etch results may comprise either an actual etching image 646 or a simulated etching image from an etching image simulator 620 at the choice of the user. The actual etching image 646 could be an actual image of a wafer that has been exposed under the photoresist conditions the user wishes to simulate, and then etched in accordance with the etching parameters desired to be simulated. As discussed above with respect to FIG. 6(*a*), the etching image simulator 620 generates a simulation of the image transferred on a photoresist-coated wafer that has been exposed through a mask and then etched. As discussed above, the initial input to the etching simulation is the reference data 655—in this manner a proper comparison can be performed between the real results data and the summing device output 675.

The difference device 680 takes the difference between the real result 650 and the output of the summing device 675, and the output of the difference device 680 is provided to a minimizer 670. The minimizer 670 acts to zero the output of the difference device 680 by adjusting the output of the summing device 675. The minimizer 670 performs this by generating feedback signals to the stepper image generator 600 and the calibrator 660 such that the values assigned to particular physical and non-physical variables respectively are altered in a predetermined manner to zero the output of the difference device 680.

This initialization procedure is continued until the system achieves a zero output from the difference device 680, at which time, the proper variable settings in the stepper image generator 600 and calibrator 660 have been achieved. At this point, the variables within the stepper image generator 600 and calibrator 660 have been set by the minimizer 670 such that the output of the summing device 675 is substantially equal to the desired real result 650 which may, as stated above, in one instance be a photoresist simulation and in another an etching simulation. These variable settings are then, in one embodiment, "locked in" while simulations are performed on real physical masks 604 to obtain the desired results.

Once the system has been initialized with the reference data 655, simulation of a physical mask 604 then comprises simply providing image data of defect areas to the stepper image generator 600 and calibrator 660 as discussed earlier with respect to FIG. 4, and then summing the output of these two devices. The end result is the calibrated simulation output 690, which reflects the desired simulation result such as a photoresist or etching processes.

In one embodiment, the calibrator 660 can include a computer program that provides an output comprising a set of non-physical variables whose values are dependent upon the reference data 655 input and the feedback from the minimizer 670. Similarly, the summing device 675, difference device 680 and minimizer 670 may also, in one embodiment, comprise a computer program that executes the steps set out above.

Figure 7A:
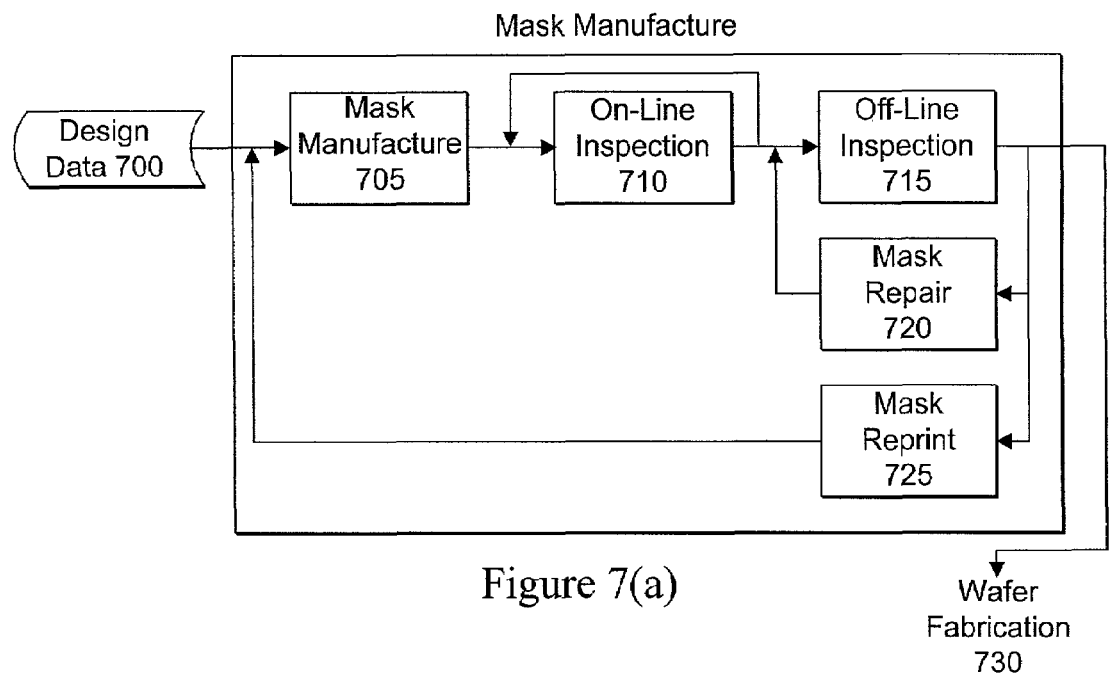
FIGS. 7(a)–(b) illustrate simplified mask manufacture and wafer fabrication process flow diagrams showing how an embodiment of the present invention could be integrated into these processes.
Figure 7B:
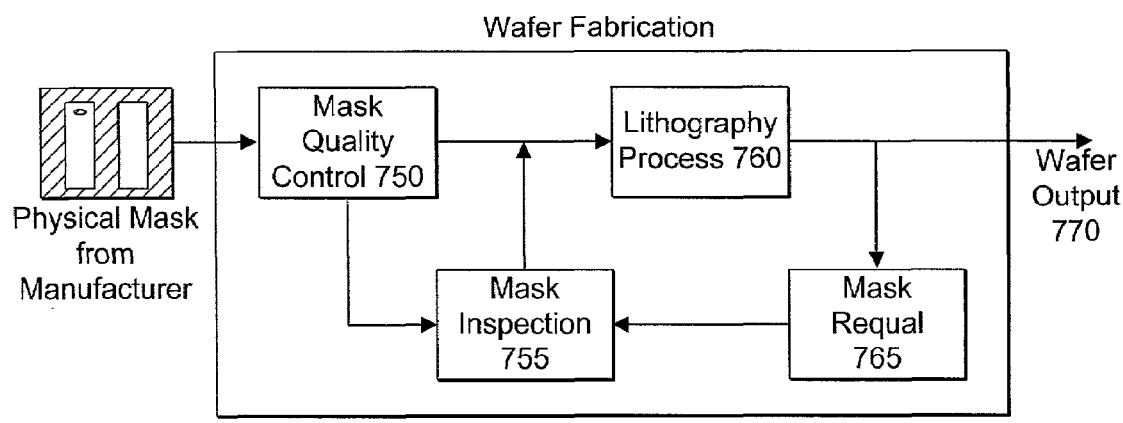

FIGS. 7(*a*)–(*b*) illustrate, in block diagram form, various situations in which the present invention could be used in the areas of lithography mask manufacture and wafer fabrication. For instance, referring to FIG. 7(*a*), a mask manufacturer uses design data 700 supplied by an integrated circuit designer to produce a physical mask 705 which must be inspected prior to being sent to a wafer fabrication plant 730. If the mask fails inspection, it must be either repaired 720 or reprinted 725 and then re-inspected. This inspection could be done on-line 710 or off-line 715 using various embodiments of the present invention. For instance, an on-line 710 embodiment of the present invention could be configured to work in parallel with a conventional mask inspection tool where the inspection is on-the-fly. All such an embodiment would need is a feed of image data representative of any potential defects the mask inspection tool detects in order to produce wafer simulations of the current microscope image. Another embodiment of the present invention could be implemented directly within an on-line inspection system, to provide quick real time assessment of potential defect areas flagged by a SEM for instance. With respect to off-line inspection 715, one embodiment of the invention can utilize previously stored defect data independently of, or together with, an off-line microscope review station. Finally, an embodiment of the present invention could be utilized by mask manufacturers to inspect the repair site of a mask undergoing repair 720 in an in situ manner to qualify individual repair sites separately on the mask.

Turning now to FIG. 7(*b*), a wafer fabricator receives a physical mask from a manufacturer, and quality checks 750 the mask to ensure that it meets the required specifications prior to being used in lithography 760 to produce wafers 770. This quality checking step 750 can be enhanced by analyzing the mask 755 with an embodiment of the invention similar to those discussed above with respect to FIG. 7(*a*). Furthermore, a wafer fabricator can use an embodiment of the present invention to periodically re-qualify 765 a mask that has been used for a number of exposures. This becomes necessary because masks can be damaged or contaminated with particles after repeated use. Thus, an embodiment of the invention can be used to assist in overseeing this quality control process to decide whether the mask needs to be cleaned or remade.

Figure 8:
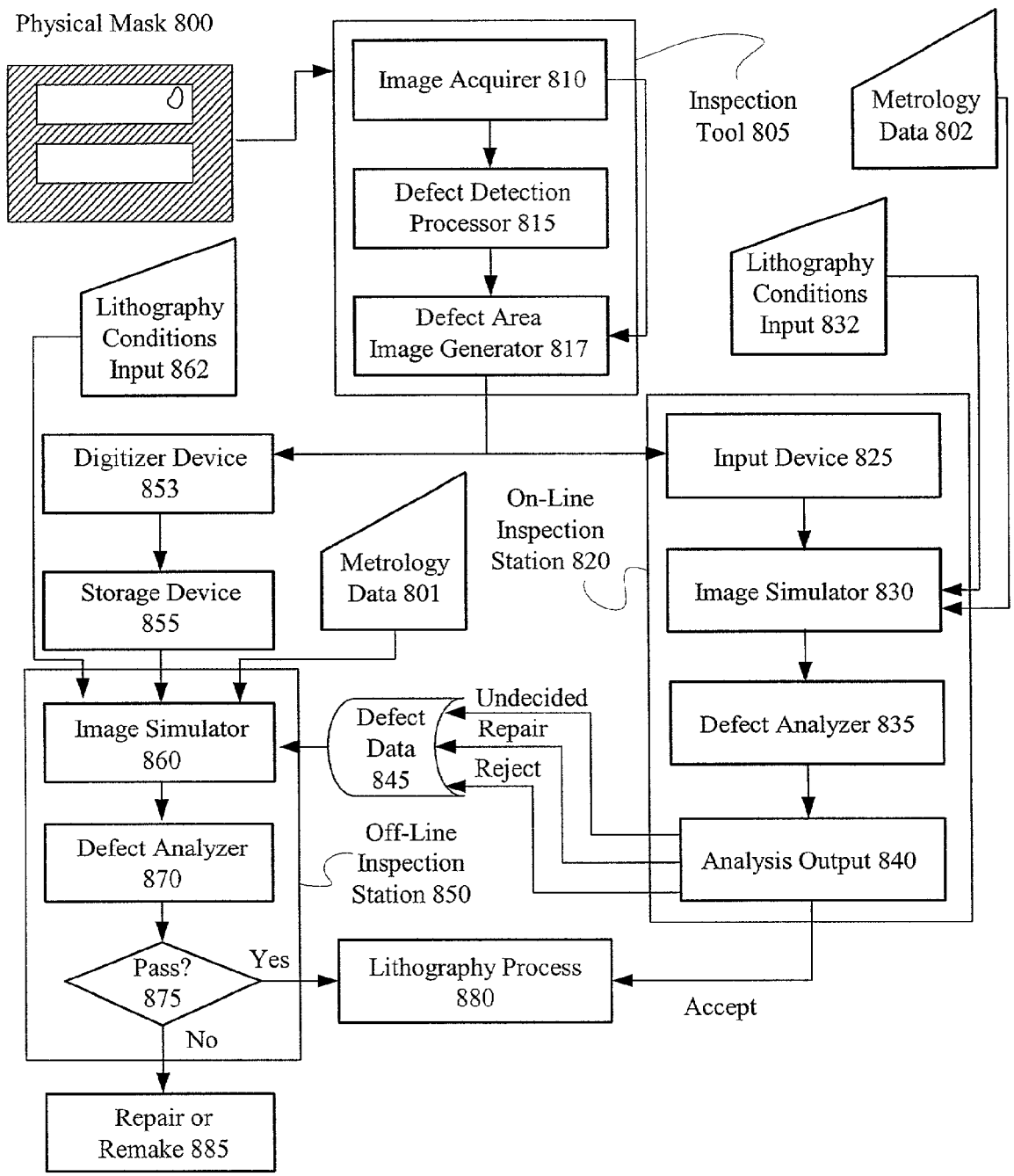
FIG. 8 illustrates a system for both on-line and off-line inspection of a mask in accordance with one embodiment of the present invention.

FIG. 8 illustrates, in a process flow diagram, one embodiment of a system for both on-line and off-line inspection of a photolithography mask in accordance with one embodiment of the invention. The system includes an inspection tool 805, an on-line inspection station 820, and an off-line inspection station 850. The inspection tool 805 includes an image acquirer 810, a defect detection processor 815 and a defect area image generator 817 each of which may operate as discussed above with respect to FIG. 4. The on-line inspection station 820 includes an input device 825 such as discussed previously with respect to FIG. 4, an image simulator 830 such as described previously with respect to FIGS. 4 and 5(b), and a defect analyzer 835. The off-line inspection station 850 includes an image simulator 860 such as described previously with respect to FIGS. 4 and 5(b), and a defect analyzer 870.

The system of FIG. 8 operates to provide a number of possible outputs with respect to the inspection of a mask as follows. The physical mask 800 is first inspected by the inspection tool 805. As described earlier with respect to FIG. 4, the inspection tool 805 scans the physical mask 800 for possible defects and the defect area image generator 817 generates defect area images of those areas of the mask containing possible defects. The defect area image data is then analyzed by the off-line inspection station 850, the on-line inspection station 820, or both.

When inspected by the off-line inspection station 850, the defect area image data is provided to a digitizer device 853 as previously discussed, and then stored in storage device 855 in any suitable image data format, such as Windows BMP, and on any suitable storage media as discussed previously. The defect area image data is then input to the image simulator 860 along with lithography conditions input 862 and metrology data 801, and a simulation of the stepper image on a wafer for the mask defect area is produced. The lithography conditions input 862 contains process specific data and the metrology data 801 contains mask specific data, as discussed previously with respect to FIG. 4. In one embodiment this simulation is performed as discussed with respect to FIG. 5(b). The simulation of the stepper image is then provided to the defect analyzer 870 so that the potential defect can be analyzed for printability and process window effects. The defect analyzer 870 may comprise a device that allows viewing the image of the simulation by an operator, such as a lithography engineer, who can then make judgments as to the severity of the potential defect. The defect analyzer 870 may also comprise a device which allows comparison of the simulated image of the defect area with a simulation of an area on the design layout which corresponds to the defect area as will be discussed with respect to FIG. 9. After the defect area is inspected, a decision 875 is made as to whether or not the mask passed the inspection. If the mask passes the inspection it is then used in the lithography process 880, while if the mask fails the inspection it is either remade or the defect(s) is/are repaired 885.

When inspected by the on-line inspection station 820, the defect area image data may be provided in real time to the input device 825, which in turn outputs this data to the image simulator 830. The image simulator 830 also receives lithography conditions input 832 that contains process specific data and metrology data 802 that contains mask specific data, as discussed previously with respect to FIG. 4. The image simulator 830 generates a simulation of the stepper image on a wafer for the mask defect area, which, in one embodiment is generated in accordance with the process discussed with respect to FIG. 5(b). Similarly, the image simulator 830 can generate a number of simulations for the defect area using ranges of input lithography conditions, and then generate a simulated process window that represents the effect the potential defect area has on the process window. The output of the image simulator 830 is provided to the defect analyzer 835, which analyzes the defect area simulation and/or the simulated process window and provides an analysis output 840. In one embodiment, the defect analyzer 835 is a computer-implemented program that processes the simulation data in light of user input defect criteria to determine whether the defect is severe enough to warrant further inspection, or whether the defect area does not print or otherwise effect the process window over a user defined set of possible lithography conditions.

Figure 11:
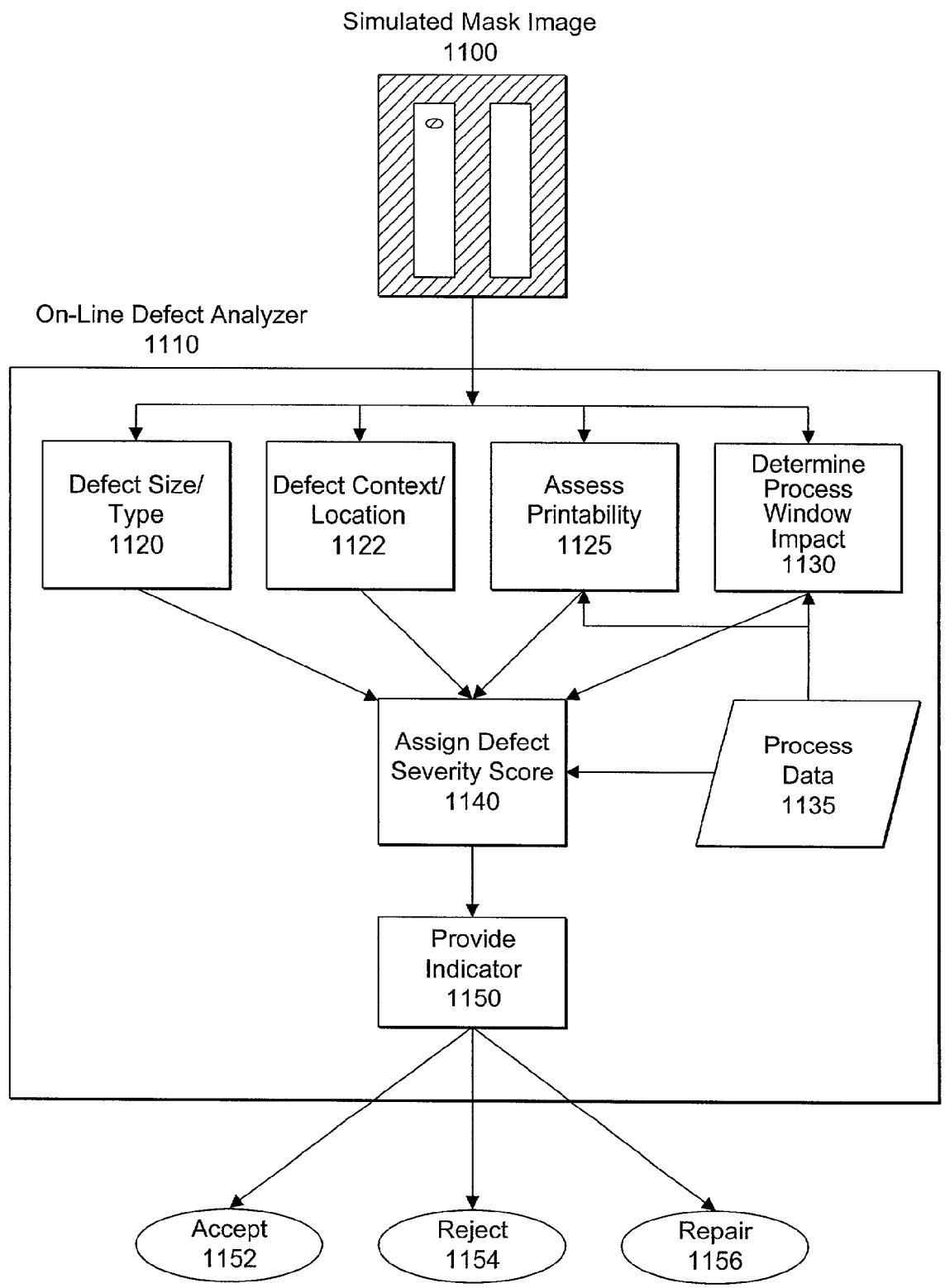
FIG. 11 illustrates a process flow chart representing one embodiment of the defect analyzer of FIG. 8.

In one embodiment, to be discussed further with respect to FIG. 11, the analysis output 840 comprises one of a number of different decision indicators. For instance, these indicators may include "reject", "repair", "accept", and "undecided" based upon a number of different criteria that the user may input into the defect analyzer 835. In the case that the analysis output is "accept", the mask is sent on to the lithography process 880 without further inspection. If the analysis output is "reject", "repair", or "undecided", the defect area image data may be stored at block 845 and then input to the off-line inspection station 850 for further analysis by a more skilled operator, such as a lithography engineer.

Figure 9:
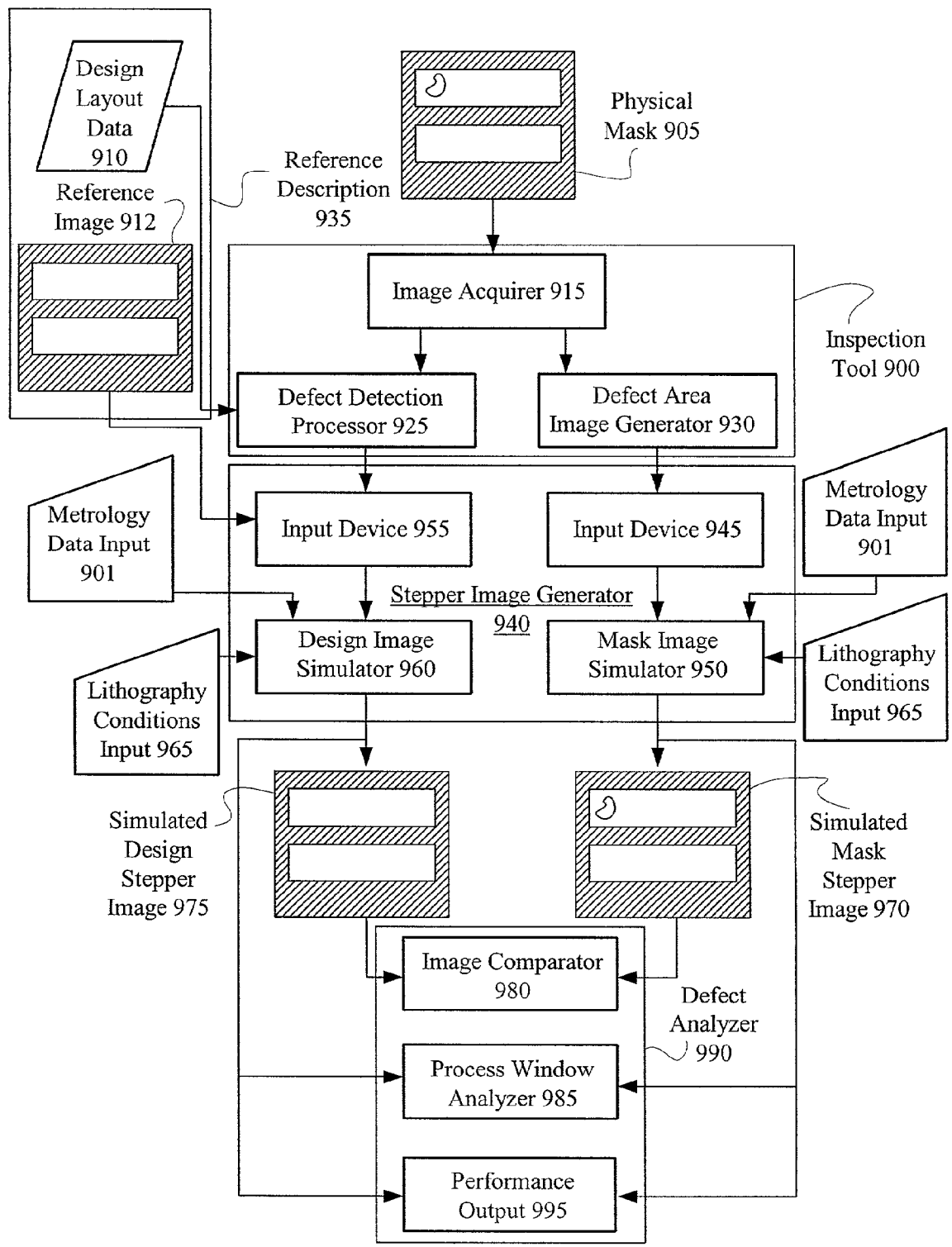
FIG. 9 illustrates another system for the inspection of a mask in accordance with one embodiment of the present invention.

FIG. 9 illustrates, in a process flow diagram, another embodiment of a system for analyzing a lithography mask in accordance with one embodiment of the present invention. The system includes an inspection tool 900, a stepper image generator 940, and a defect analyzer 990. Inputs to the system include a physical mask 905, a reference description 935, lithography conditions 965, and metrology data input 901. The reference description 935 comprises data that represents a defect free design layout of the physical mask 905. In one instance this data may comprise reference image 912 which could be an image of a physical mask that has been previously inspected and determined to be free from defects. In another instance, this reference description may comprise the design layout data 910 for the physical mask 905. The inspection tool 900 includes an image acquirer 915, a defect detection processor 925 and a defect area image generator 930 each of which may operate as discussed above with respect to FIG. 4. The stepper image generator 940 includes input devices 945 and 955 such as discussed previously with respect to FIG. 4, a mask image simulator 950 such as described previously with respect to FIGS. 4 and 5(b), and a design image simulator 960 which operates as discussed with respect to FIG. 5(a) and/or FIG. 5(b) depending on the input to the input device 955. The defect analyzer 990 may include an image comparator 980, a process window analyzer 985, and a performance output device 995.

The system of FIG. 9 operates to analyze a physical mask 905 as follows. The physical mask 905 is first inspected by the inspection tool 900. As described earlier with respect to FIG. 4, the inspection tool 900 scans the physical mask 905 for possible defects and the defect area image generator 930 generates defect area images of those areas of the mask containing possible defects. The defect detection processor 925 may also receive design layout data 910 as an input. In this instance, for each defect area image that is generated, the defect detection processor 925 may operate to locate the corresponding area on the design layout data 910 and provide this information to input device 955. In one embodiment the design layout data 910 is in GDS-II format. The defect area image generator 930 provides the defect area image data to the input device 945 of the stepper image generator 940 which processes the data as discussed previously. The mask image simulator 950 receives the processed image data from the input device 945, lithography conditions input 965, and metrology data input 901 and generates a simulated mask stepper image 970 and simulated process window information in a manner described above with respect to FIG. 5(b).

The input device 955 of the stepper image generator 940, in one instance, receives the design layout data 910 corresponding to the defect area from the defect detection processor 925 and provides the design image simulator 960 with design data representing an area to be simulated that corresponds to the defect area being simulated. The design image simulator 960, using the same lithography conditions input 965 and metrology data input 901, generates a simulated design stepper image 975 and simulated process window information in a manner described above with respect to FIG. 5(*a*). Similarly, in another instance, the reference image 912 may be provided to the input device 955, and the design image simulator 960 may then use the reference image data to generate the simulated design stepper image 975 and simulated process window information in a manner described above with respect to FIG. 5(*b*).

Figure 15:
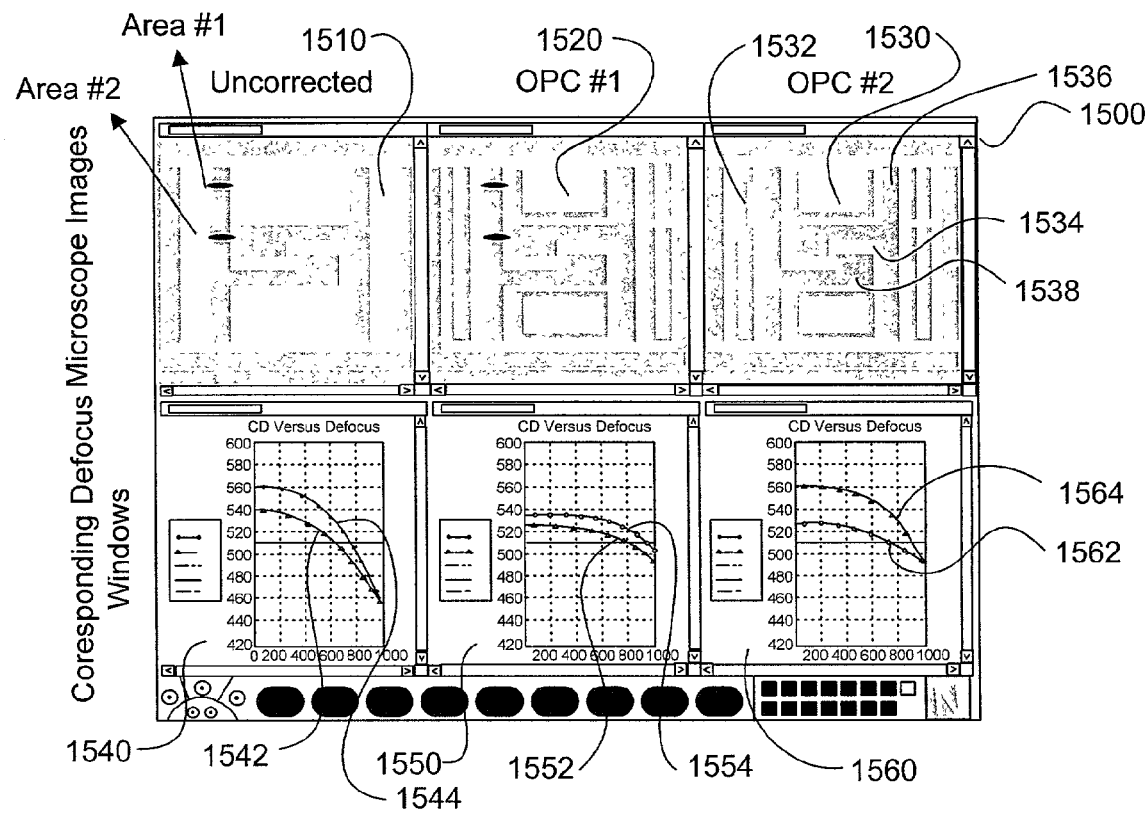
FIG. 15 illustrates a further screen shot of a computer program operating in accordance with one embodiment of the present invention in which the mask being inspected has been OPC corrected, in which a process window related output is shown.
Figure 17:
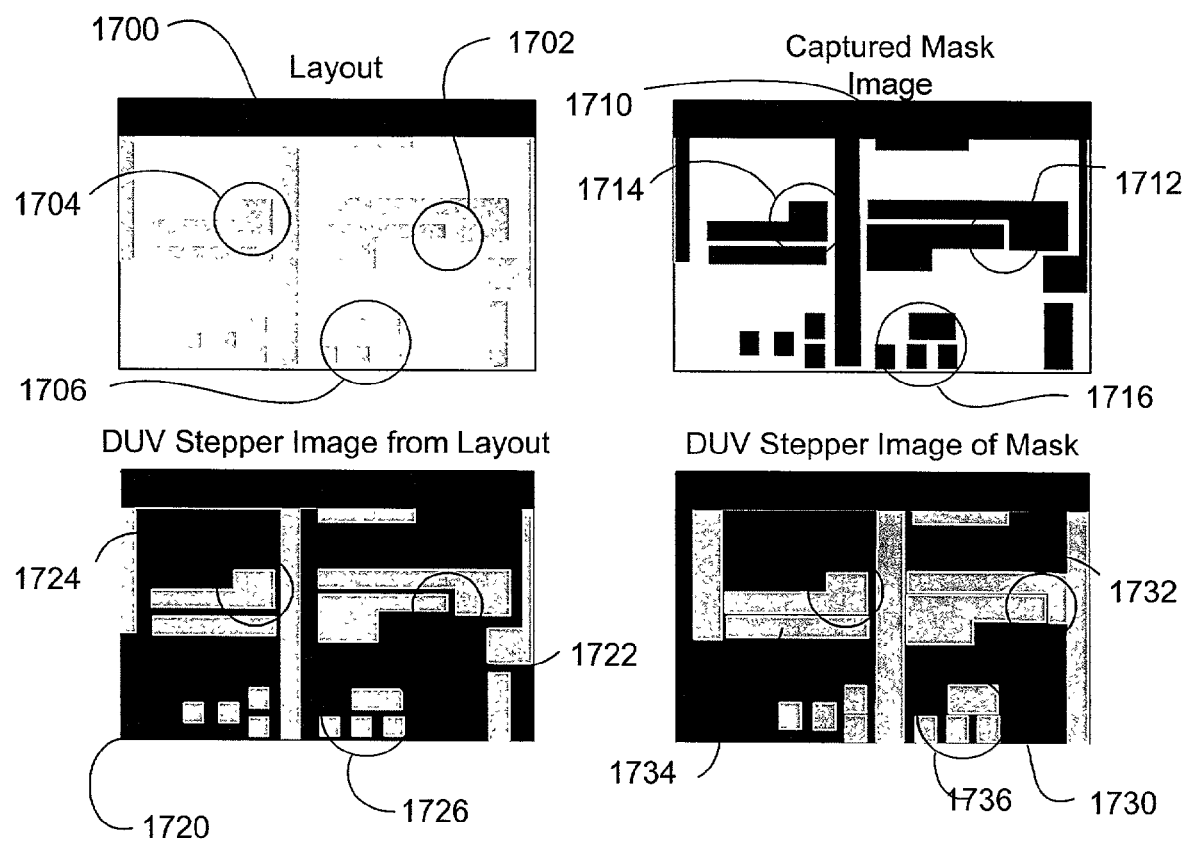
FIG. 17 illustrates several screen shots of a computer program operating in accordance with one embodiment of the present invention in which a simulated mask image is compared to a simulated design image in order to reveal potential defect areas.
Figure 19:
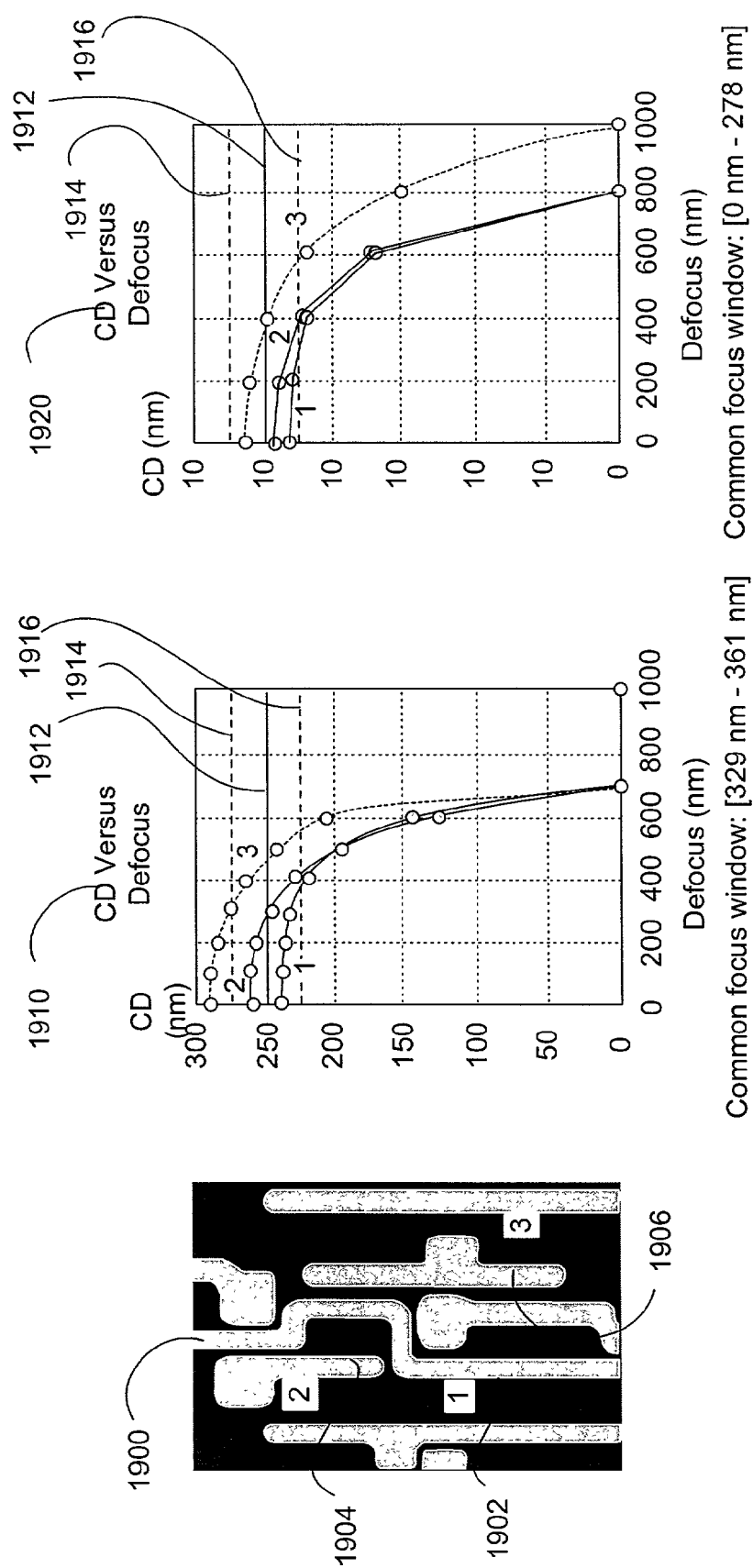
FIG. 19 illustrates several screenshots of a computer program operating in accordance with one embodiment of the present invention in which the effect of defects on the process window is demonstrated.
Figure 20:
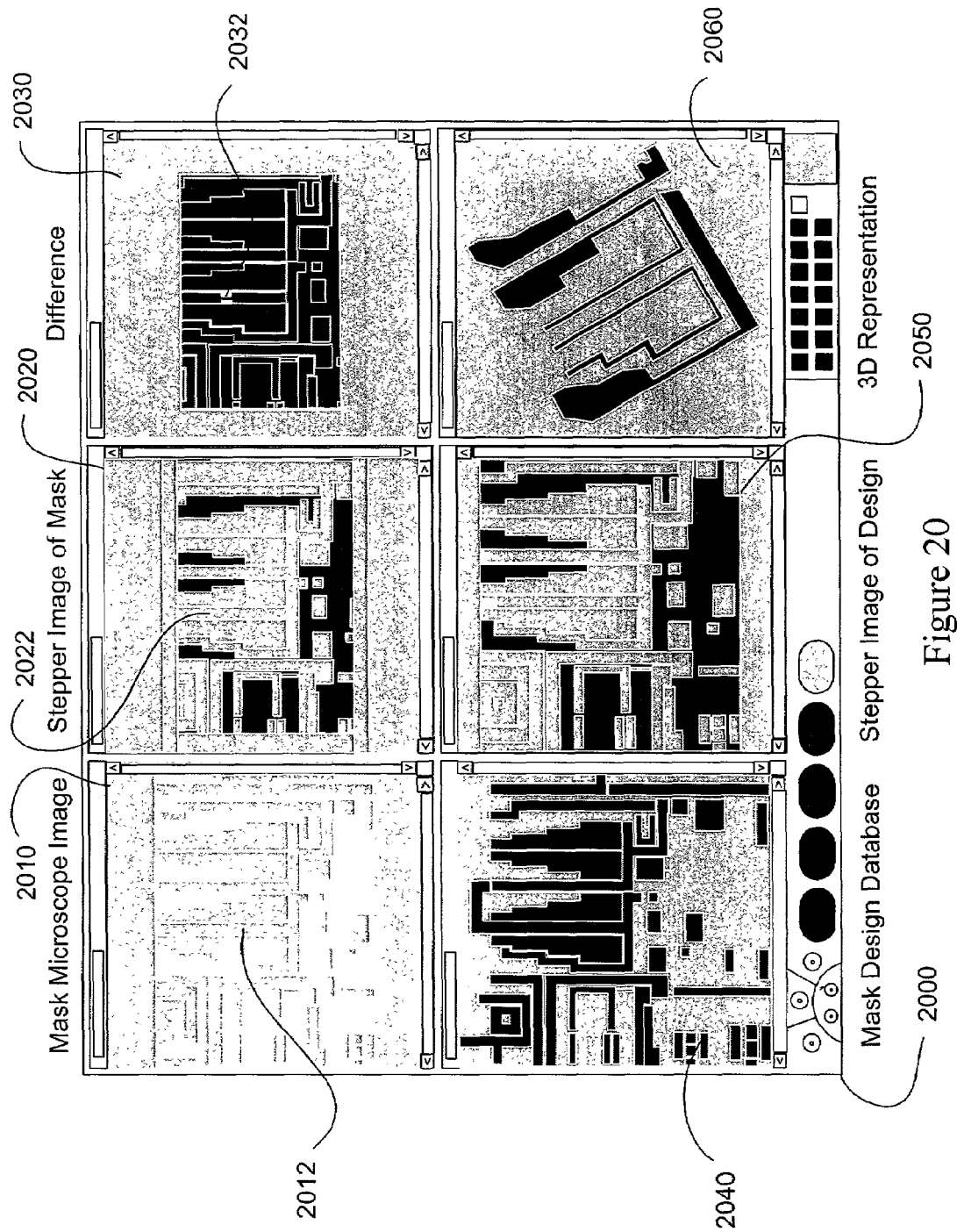
FIG. 20 illustrates a further screen shot of a computer program operating in accordance with one embodiment of the present invention in which a simulated mask image is compared to a simulated design image.

The simulated mask stepper image 970 and the simulated design stepper image 975 are provided to the image comparator 980 of the defect analyzer 990. In one embodiment the defect analyzer 990 includes a computer-implemented program that is capable of displaying the images 970 and 9751 and displaying the differences between the two such that an operator can visually detect any differences—the output of an embodiment of such a program is illustrated in FIGS. 17 and 20 below. The simulated process window data from the stepper image generator 940 is provided to the process window analyzer 985 of the defect analyzer 990. In one embodiment, the process window analyzer 985 is a computer-implemented program capable of displaying the effect that a potential defect area has on the overall process window of the lithography process as compared to the "perfect" design mask. Such a process window output will be described further with respect to FIGS. 10(*a*)–(*c*) below, and is also illustrated in FIGS. 15 and 19. The outputs of the stepper image generator 940 for the physical mask 905 and the reference description 935 are also provided to a performance output device 995. The performance output device 995 in one embodiment is a computer-implemented program capable of determining and displaying the effect that one or more defects have on the overall performance of the integrated circuit for which the physical mask 905 will be used to produce.

Figure 10:
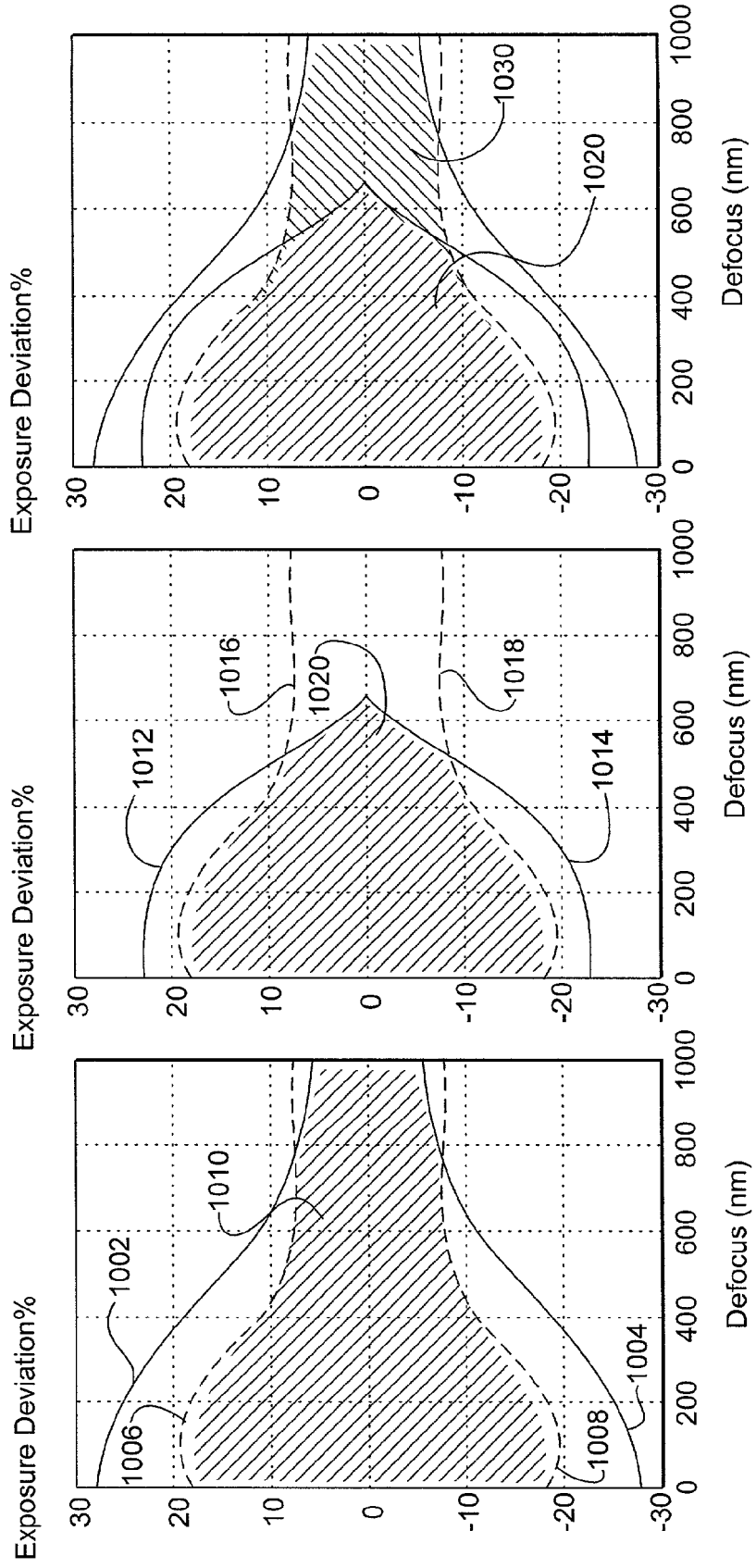
FIG. 10(a)–(c) illustrate an example of how a potential mask defect can affect the process window of the photolithography process.

FIGS. 10(*a*)–(*c*) illustrate an example of how a potential defect area could affect the overall process window of the photolithography process. FIG. 10(*a*) is an illustration of an x-y coordinate plot of data with exposure deviation % on the x-axis and lithography defocus (in nanometers) on the y-axis. Data curves 1002 and 1004 represent a typical plot of data for a first chosen area on a mask in which the area has no defect. The area between the curves 1002 and 1004 represents the range of defocus and exposure deviation values that would still give acceptable lithography results at the first chosen area in accordance with a user defined set of acceptance criteria. Data curves 1006 and 1008 represent a typical plot of data for a second chosen area on a mask in which the area has no defect. The area between the curves 1006 and 1008 represents the range of defocus and exposure deviation values that would still give acceptable lithography results at the second chosen area in accordance with the same user defined set of acceptance criteria. Area 1010 defines the overlap of the above two bounded areas, and represents the range of defocus and exposure deviation values which would give acceptable lithography results at both areas in accordance with the user defined set of acceptance criteria. The process window plot depicted in FIG. 10(*a*) could contain additional curves representing additional chosen areas on the mask in order to define the range of acceptable lithography conditions more finely. Further, different parameters could be plotted on the x-axis and the y-axis including critical dimension, temperature and exposure dose in order to determine the sensitivity of the acceptable lithography conditions to variations in the parameters affecting the lithography process.

FIG. 10(*b*) is an illustration of a process window for the same mask as in FIG. 10(*a*), except that the first chosen area contains a defect. Thus, data curves 1012 and 1014 represent a typical plot of data for a first chosen area on a mask in which the area has a defect. The area between the curves 1012 and 1014 represents the range of defocus and exposure deviation values that would still give acceptable lithography results at the first chosen area in accordance with a user defined set of acceptance criteria. Data curves 1016 and 1018 correspond directly with curves 1006 and 1008 of FIG. 10(*a*), as does the area between curves 1016 and 1018. Area 1020 defines the overlap of the above two bounded areas, and represents the range of defocus and exposure deviation values which would give acceptable lithography results at both areas in accordance with the user defined set of acceptance criteria. Note that the defect at the first chosen area, in this example, has decreased the range of lithography conditions that will give an acceptable result. Note also that this could be the case, in some examples, even if the defect did not print. FIG. 10(*c*) is provided to clearly illustrate the effect that a defect at a mask area can have on the process window. Area 1030 represents the difference between area 1010 and area 1020, and therefore represents the range of lithography conditions that are effectively made unavailable to the lithographer as a result of the defect.

FIG. 11 illustrates a process flow chart representing one embodiment of the on-line defect analyzer 835 of FIG. 8. A simulated mask image 1100, such as provided by the image simulator 830 of FIG. 8, is provided to the on-line defect analyzer 1110. The defect analyzer 1110 provides an indicator 1150 to a user, such as a mask fabrication line worker, as to the status of any defect area on the mask image 1100. This indication, in one embodiment, comprises one of the three indicators "accept" (1152), "reject" (1154), or "repair" (1156), and may be implemented with any means that alerts the user as to the status of the mask. This means may consist of an illuminated red light when the indicator is either "reject" or "repair", and an illuminated green light when the indicator is "accept". The defect analyzer 1110 generates the indicator based upon an analysis of the mask image 1100 with respect to user input inspection criteria. In one embodiment, the defect analyzer 1110 assigns a defect severity score 1140 to the defect on the simulated mask image, and provides one of the three indicators in response to the defect severity score 1140. This defect severity score 1140 may be a weighted score which takes into account various parameters associated with the defect including, defect size and type 1120, defect context and location (i.e. for instance if the defect is near a transistor gate, it might be weighted more heavily) 1122, printability of the defect 1125, process window impact 1130 of the defect, and the wafer process data 1135 such as the lithography conditions and the metrology data for the mask used to expose the wafer. As discussed earlier, the wafer process data 1135 may also be used in determining the printability 1125 and process window impact 1130 of a defect. In one embodiment of the invention, each of the aforementioned inputs to the severity score 1140 may be weighted according to user preference. The defect analyzer 1110 is, in one embodiment, a program implemented by a computer that interfaces with a set of indicator lights to provide the output indicator 1150. As discussed previously with respect to FIG. 8 the defect analyzer may also provide for the storage of defect data, thereby allowing an inspection engineer to analyze the data off-line.

The remaining figures illustrate sample screen shots taken of a computer-implemented program which utilizes one embodiment of the present invention. All images described as microscope images in the remaining figures were taken with a transmission mode microscope. Thus, bright areas represent quartz (clear) areas on the mask, and dark areas represent chrome (opaque) areas. The images described as simulated wafer images in the remaining figures are similarly represented in. that bright areas represent areas on the photoresist that will be exposed to light, and dark areas represent areas on the photoresist that have not been exposed to light.

Figure 12:
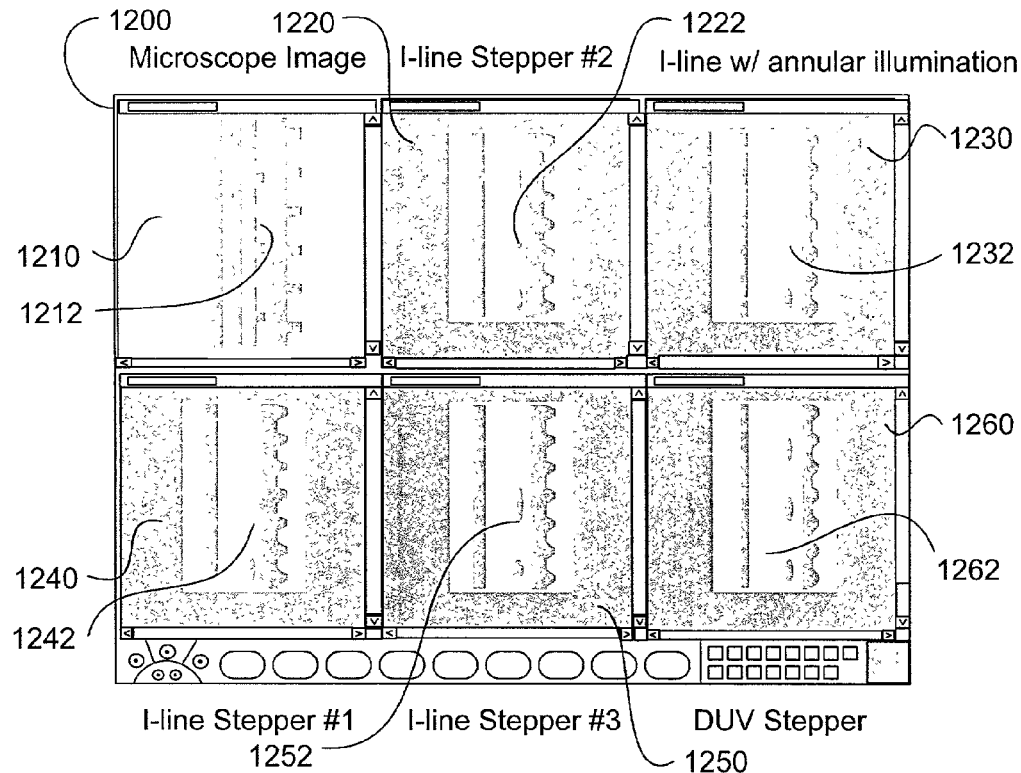
FIG. 12 illustrates a screen shot of a computer program operating in accordance with one embodiment of the present invention in which a mask with a defect is simulated to print under different stepper conditions.

For example, FIG. 12 illustrates a screen shot 1200 comprising windows 1210, 1220, 1230, 1240, 1250, and 1260 in which a defective mask is simulated to print under 5 different stepper conditions. Window 1210 illustrates a captured microscope image of a mask containing various defects of different sizes such as defect 1212. Window 1220 illustrates the simulated wafer exposure of the mask of window 1210 under a particular set of I-line stepper conditions. Window 1230 illustrates the simulated wafer exposure of the mask of window 1210 under a set of I-line stepper conditions in which annular illumination is used. Window 1240 illustrates the simulated wafer exposure of the mask of window 1210 under another particular set of I-line stepper conditions. Window 1250 illustrates the simulated wafer exposure of the mask of window 1210 under still another set of I-line stepper conditions. Finally, window 1260 illustrates the simulated wafer exposure of the mask of window 1210 under a particular set of Deep Ultra-Violet (DUV) stepper conditions.

FIG. 12 illustrates the problem of identifying defect printability that is associated with the prior art. Note how all of the defects present in window 1210 do not show up or "print" in the final simulated wafer exposure under the various stepper conditions illustrated in windows 1220–1260. In particular, it is of note that defect 1212 does not print under some conditions as shown by defect simulation marks 1232 and 1242, while under other conditions defect 1212 does print as shown by defect simulation marks 1222, 1252, and 1262. Without the information provided in FIG. 12, an inspection engineer would have to rely on his experience, or use actual wafer exposures to determine whether a defect will print (or otherwise detrimentally affect the process window as will be explained below) under a particular set of lithography conditions.

Figure 13:
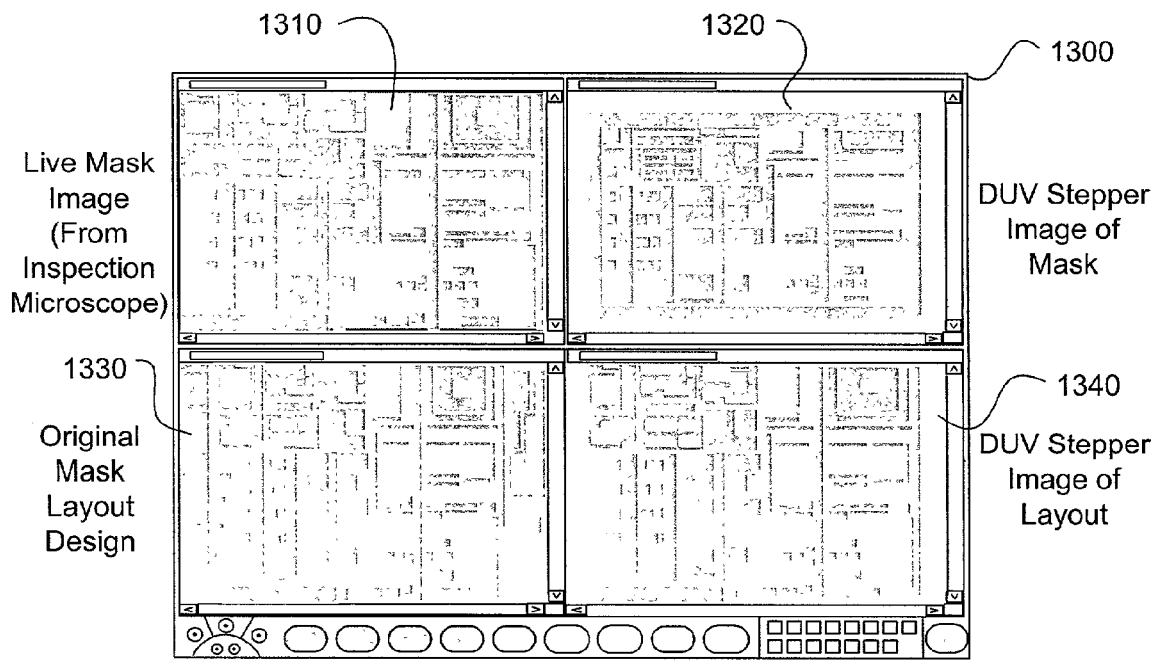
FIG. 13 illustrates a screen shot depicting the user interface of a computer program operating in accordance with one embodiment of the present invention.

FIG. 13 illustrates a screenshot 1300 of one embodiment of the graphical user interface of a computer implemented program utilizing one embodiment of the present invention. The screenshot 1300 comprises windows 1310, 1320, 1330, and 1340. Window 1310 illustrates a captured microscope image of a portion of a mask while window 1320 illustrates the simulated wafer exposure of the mask of window 1310 under a particular set of DUV stepper conditions. Window 1330 illustrates the original mask layout design of the portion of the mask shown in window 1310, and window 1340 illustrates the simulated wafer exposure of the original mask layout design of window 1330 using the same stepper conditions as for the simulation displayed in window 1320. As can be seen from FIG. 13, the present invention allows one to compare directly the stepper image of the original design with the stepper image of the manufactured mask in order to determine the affect of a defect on the original design.

Figure 14:
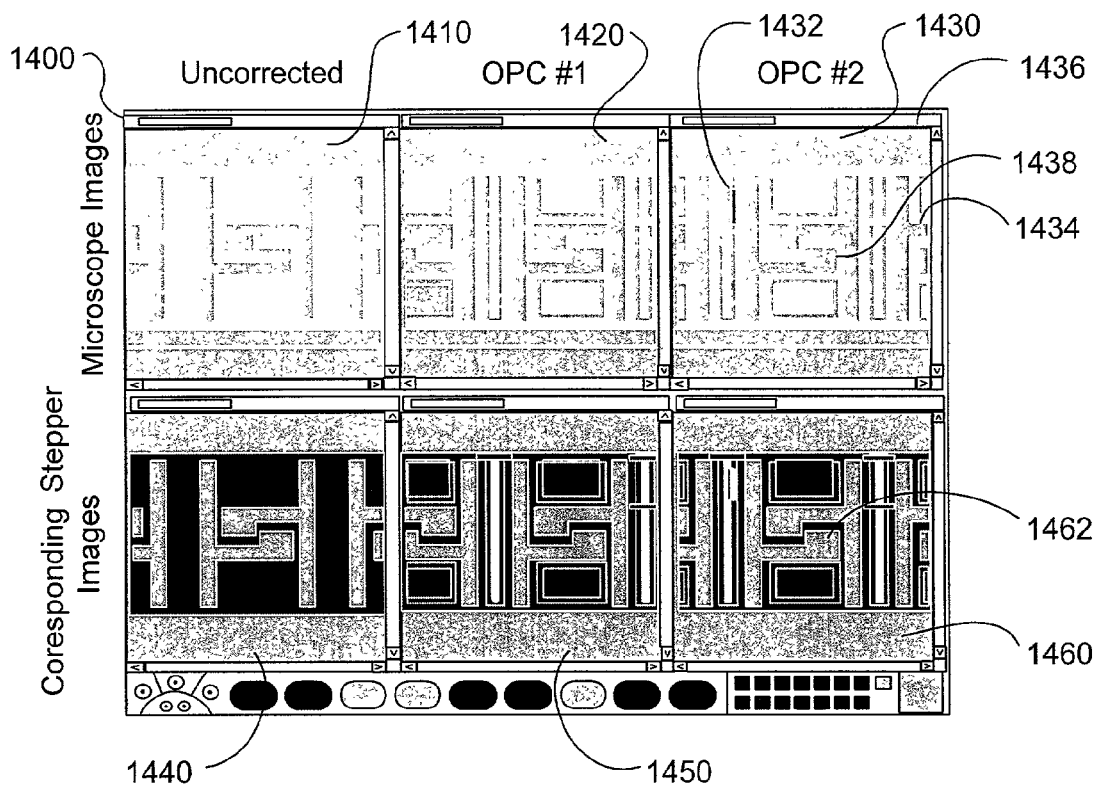
FIG. 14 illustrates a screen shot of a computer program operating in accordance with one embodiment of the present invention in which the mask being inspected has been OPC corrected.

FIG. 14 illustrates a screenshot 1400 of a computer-implemented program utilizing one embodiment of the present invention in which the mask being analyzed has been OPC corrected. The screenshot 1400 comprises windows 1410, 1420, 1430, 1440, 1450 and 1460. Window 1410 illustrates a captured microscope image of a portion of a mask. Window 1420 illustrates a captured microscope image of the same portion of an OPC corrected mask. Window 1430 illustrates a captured microscope image of the same portion of an OPC corrected mask with a defect 1432 in one of the OPC assist bar features. Window 1430 also shows other OPC features including positive serifs such as serif 1436 to counter line end shortening and serif 1438 to counter corner under exposure, and negative serifs such as serif 1434 to counter corner over exposure. Window 1440 illustrates the simulated wafer exposure, of the mask of window 1410 under a particular set of stepper conditions. Window 1450 illustrates the simulated wafer exposure of the OPC corrected mask of window 1420 under the same set of stepper conditions, and window 1460 illustrates the simulated wafer exposure of the defective OPC corrected mask of window 1430 under the same set of stepper conditions.

As can be seen from FIG. 14, the present invention allows an operator to visually detect whether an OPC defect would print on the stepper image of the manufactured mask by looking at the window 1460. In this example, defect 1432 shows up in the stepper image of window 1460 as defect print 1462. Whether or not this defect will have any detrimental effect on the operation of the designed circuit can also be determined as described previously above. Further, by looking at the simulated wafer Ad exposure image, the operator can see if the designed OPC corrections, even if not defectively reproduced on the mask, are performing their OPC function correctly. For instance, if the simulated wafer exposure shows primitive geometries with corners that are not square enough, the operator can determine that the serifs 1436, 1438 and negative serifs 1434, are not properly sized. Similarly, if the operator determines that the OPC features are over or under sized, then the operator can use this information to try and determine if their was a problem in the conversion of OPC features during data conversion or mask write.

Although defective sub-resolution OPC features may not print, they may affect the manufacturing process window in ways that are important to the overall process. For instance, the defocus variable in the lithography process may change slightly from exposure to exposure with a given stepper system. Previously, one would have to compare actual exposures for each defocus value of interest in order to determine the overall effect of a defect throughout this range. The application of the present invention to this problem is shown in FIG. 15 which illustrates a screenshot 1500 of a computer-implemented program utilizing one embodiment of the present invention in which the mask being inspected has been OPC corrected. The screenshot 1500 comprises windows 1510, 1520, 1530, 1540, 1550 and 1560. Window 1510 illustrates the same captured microscope image of a portion of a mask as shown in window 1410 of FIG. 14. Window 1520 illustrates the same captured microscope image of a portion of an OPC corrected mask as shown in window 1420 of FIG. 14. Window 1530 illustrates the same captured microscope image of a portion of an OPC corrected mask with a defect 1532 in one of the OPC assist bar features as shown in window 1430 of FIG. 14. Window 1530 also shows other OPC features including positive serifs such as serif 1536 to counter line end shortening and serif 1538 to counter corner under exposure, and negative serifs such as serif 1534 to counter corner over exposure.

Window 1540 illustrates a process window which has been calculated for a range of simulated wafer images of the captured mask image of window 1510 in which a number of different defocus values were used. The process window illustrated in window 1540 displays Critical Dimension vs. Optical Defocus for two areas of the captured mask shown in window 1510. Curve 1542 displays data obtained from the range of simulations for Area #2, and curve 1544 displays data obtained for Area #1. Window 1550 illustrates a similar process window obtained for the OPC corrected mask image of window 1520. Again, curve 1552 displays data obtained from the range of simulations for Area #2, and curve 1554 displays data obtained for Area #1. Lastly, window 1560 illustrates a similar process window obtained for the defective OPC corrected mask image of window 1520. Again, curve 1562 displays data obtained from the range of simulations for Area #2, and curve 1564 displays data obtained for Area #1. Note that the although the defect 1532 was not shown to be significantly printable in window 1460 of FIG. 14, the same defect 1532 could still have a large effect on the available process window as shown by a comparison of the curves in windows 1550 and 1560.

Figure 16:
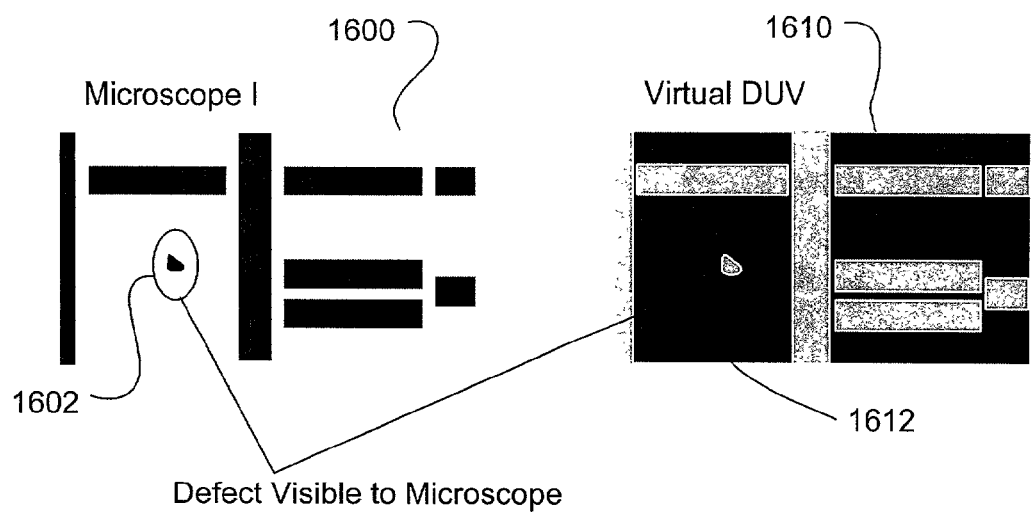
FIG. 16 illustrates a situation in which an identified mask defect is shown not to print under a particular set of stepper conditions by a computer program operating in accordance with one embodiment of the present invention.

FIG. 16 illustrates a situation in which an identified defect is shown not to print under a particular set of stepper conditions by a computer-implemented program incorporating one embodiment of the present invention. FIG. 16 comprises a portion of a screenshot 1600 from the aforementioned computer program, which shows a captured microscope image of a portion of a mask with a defect 1602. FIG. 16 further comprises a portion of a screenshot 1610 from the aforementioned computer program which shows the simulated wafer exposure of the mask of window 1610 under a particular set of DUV stepper conditions. Area 1612 of window 1610 corresponds to defect 1602, and shows that the defect 1602 will not print under the particular stepper conditions. Therefore, in this situation it would be unnecessary to discard this mask based on defect 1602. Further, it would also be unnecessary to perform a repair of defect 1602 while risking unseen damage to the repaired site.

FIG. 17 illustrates several screenshots 1700, 1710, 1720, and 1730 of a computer-implemented program utilizing one embodiment of the present invention in which it is demonstrated that the comparison of a stepper image directly from the layout database and a stepper image simulated from the captured mask image may yield problem areas. The screenshot 1710 illustrates a captured microscope image of a portion of a mask while screenshot 1730 illustrates the simulated wafer exposure of the mask of screenshot 1710 under a particular set of DLTV stepper conditions. Screenshot 1700 illustrates the original mask layout design of the portion of the mask shown in screenshot 1710, and screenshot 1720 illustrates the simulated wafer exposure of the original mask layout design of screenshot 1700 using the same stepper conditions as for the simulation displayed in screenshot 1730. Looking at areas 1732, 1734, and 1736 of screenshot 1730 it becomes apparent to an operator that there are problem areas to be considered. However, without the simulated mask exposure image these areas would not be as readily apparent as one would have to compare the captured mask image of screenshot 1710 with the original layout image of screenshot 1700. Specifically, when one compares areas 1712, 1714, and 1716 of screenshot 1710 (or even areas 1722, 1724, and 1726 of screenshot 1720) to areas 1702, 1704, and 1706 of screenshot 1700, these problems are not as easily discovered.

Figure 18:
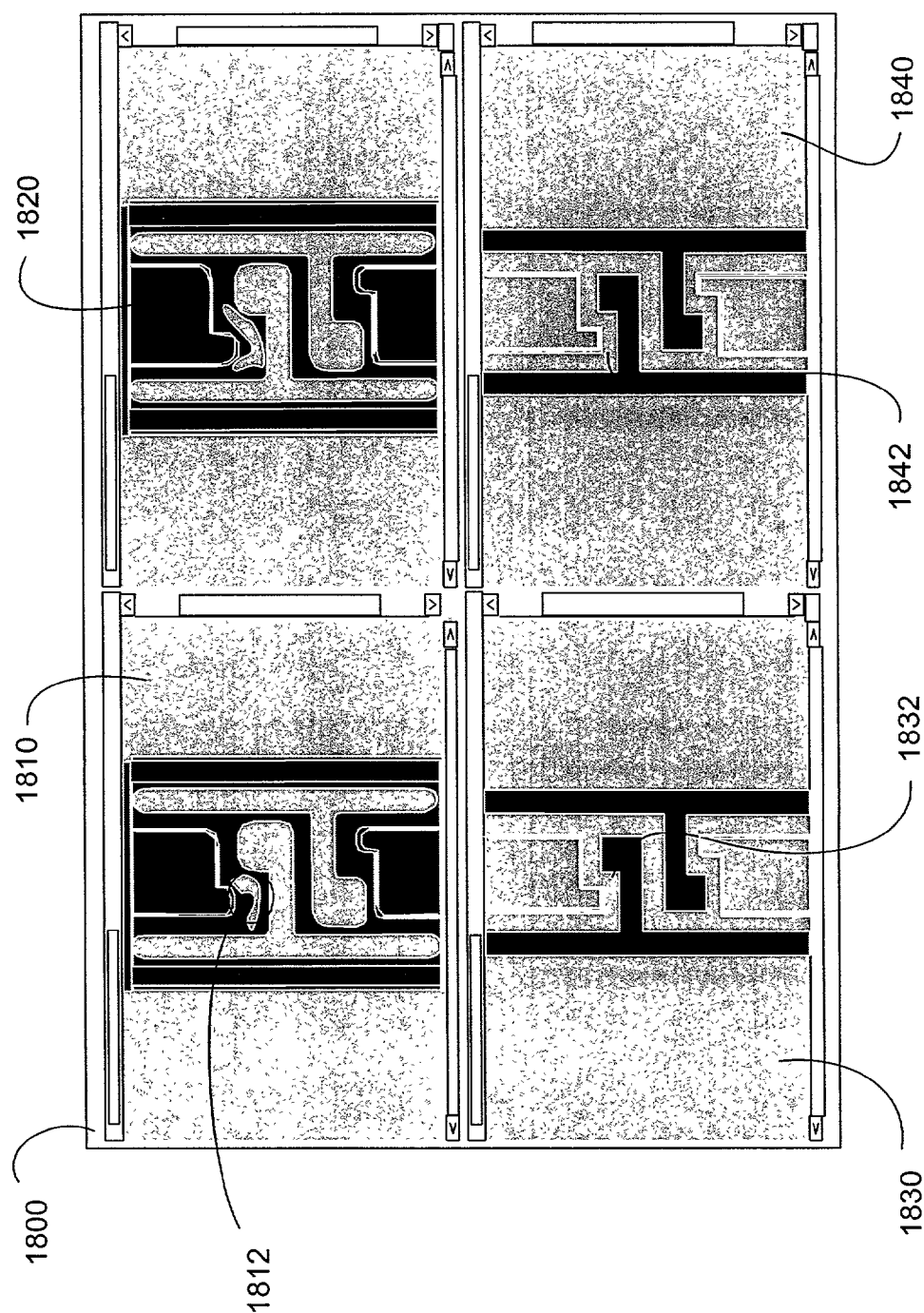
FIG. 18 illustrates a still further screen shot of a computer program operating in accordance with one embodiment of the present invention in which the mask being inspected has been OPC corrected.

FIG. 18 illustrates a screenshot 1800 of a computer-implemented program utilizing one embodiment of the present invention in which the mask being analyzed has been OPC corrected. The screenshot 1800 comprises windows 1810, 1820, 1830, and 1840. Window 1830 illustrates an original layout of a portion of an OPC corrected mask with a small defect on an assist line as shown in area 1832. Window 1840 illustrates an original layout of a portion of the same OPC corrected mask but without the defect as shown in area 1842. Window 1810 illustrates the simulated wafer exposure of the mask of window 1830 under a particular set of stepper conditions, wherein the exposure shows the small defect on the assist line as shown in area 1812. Window 1820 illustrates the simulated wafer exposure of the mask of window 1840 under the same set of stepper conditions.

It is of note that the small defect shown in area 1832 prints under the particular stepper conditions simulated in FIG. 18. This small defect might be overlooked by conventionally used methods for inspecting OPC corrected masks. For, as stated previously, the OPC feature sliding tolerance scale used by some previous methods would not consider this slight deviation a defect if its size were smaller than the arbitrarily set scale. However, as shown here, because of the location and purpose of OPC features such as the defective assist line shown in area 1832, such small defects could print and therefore affect the operation of the end product circuit.

FIG. 19 illustrates several screenshots 1900, 1910, and 1920 of a computer-implemented program utilizing one embodiment of the present invention in which the effect of defects on the lithography process window is demonstrated. The screenshot 1900 illustrates the simulated wafer exposure of a mask in which an area with no defect 1902 and two defect areas 1904 and 1906 are shown. Screenshot 1910 illustrates a simulated process window plot of Critical Dimension vs. Defocus for each of the areas 1902, 1904, and 1906, where data line 1 corresponds to the non defect area 1902, data line 2 corresponds to the defect area 1904, and data line 3 corresponds to defect area 1906. Line 1912 represents the user-defined value of target CD for the mask, whereas lines 1914 and 1916 represent the upper and lower bounds of acceptable CD for the mask. The simulation illustrated in screenshot 1910 was performed for a lithography system with a Numerical Aperture of 0.50. Screenshot 1920 illustrates the same simulation as screenshot 1910, except that the Numerical Aperture of the simulated system was 0.42. From the process windows illustrated in screenshots 1910 and 1920 a user can determine the range of acceptable defocus values of an exposure utilizing the mask under inspection. For example, with respect to screenshots 1910 and 1920, the range of acceptable defocus values is that range within which the CD value of each of the three areas 1902, 1904, and 1906 falls within the upper and lower CD bounds 1914 and 1916.

Finally, FIG. 20 illustrates another screenshot 2000 of a computer-implemented program utilizing one embodiment of the present invention. The screenshot 2000 comprises windows 2010, 2020, 2030, 2040, 2050, and 2060. Window 2010 illustrates a captured microscope image of a portion of a mask with a defect in area 2012. Window 2020 illustrates the simulated wafer exposure of the mask of window 2010 under a particular set of stepper conditions, and shows the defect 2012 at area 2022. Window 2040 illustrates the original design layout of the captured mask image of window 2010. Window 2050 illustrates the simulated wafer exposure of the original design layout of window 2040 under the same particular set of stepper conditions. Window 2030 illustrates the difference between the simulated image of window 2020 and the simulated image of window 2050, and illustrates at area 2032 the overall effect of the defect 2012 on the design image. Window 2060 illustrates a 3D representation of the stepper image near the defect area.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art. Accordingly, it is intended that the scope of the invention be defined by the following claims and their equivalents.

The invention claimed is:

1. A method of analyzing a mask used in lithography for defects, the method comprising:
    providing a defect area image as a first input, wherein said defect area image comprises an image of a portion of said mask;
    providing a set of lithography parameters as a second input;
    providing a set of metrology data as a third input; and
    generating a first simulated image in response to said first input, wherein said first simulated image comprises a simulation of an image which would be printed on a wafer if said wafer were exposed to a radiation source directed at said portion of said mask, wherein the characteristics of said radiation source comprise said set of lithography parameters, and wherein the characteristics of said mask comprise said set of metrology data.

2. The method of analyzing a mask used in lithography for defects of claim 1 wherein providing said defect area image comprises:
    providing a set of potential defect criteria;
    scanning said mask for features whose characteristics fall within said set of potential defect criteria; and
    generating said defect area image in response to said scanning of said mask, wherein said defect area image comprises an image of a portion of said mask comprising at least one feature whose characteristics fall within said set of potential defect criteria.

3. The method of analyzing a mask used in lithography for defects of claim 2 wherein said mask is scanned by a device comprising one of a group of devices including an optical microscope, a scanning electron microscope, a focus ion beam microscope, an atomic force microscope, and a near-field optical microscope.

4. The method of analyzing a mask used in lithography for defects of claim 1 wherein said defect area image comprises a digital representation of said defect area image.

5. The method of analyzing a mask used in lithography for defect of claim 1 wherein said radiation source comprises a visible illumination source.

6. The method of analyzing a mask used in lithography for defects of claim 1 wherein said radiation source comprises a nonvisible illumination source.

7. The method of analyzing a mask used in lithography for defects of claim 1 wherein said radiation source comprises a plasma discharge.

8. The method of analyzing a mask used in lithography for defects of claim 1 wherein said set of lithography parameters comprises data representing at least one parameter of a group of parameters including numerical aperture, wavelength, sigma, lens aberration, defocus, and critical dimension.

9. The method of analyzing a mask used in lithography for defects of claim 1 wherein said set of metrology data comprises data representing measurements including a phase associated with said defect area image and a transmission associated with said defect area image.

10. The method of analyzing a mask used in lithography for defects of claim 1 wherein said set of metrology data comprises specification data including a phase associated with said defect area image and a transmission associated with said defect area image.

11. The method of analyzing a mask used in lithography for defects of claim 1 wherein said set of metrology data comprises data representing at least one measurement including a reflectivity of said mask.

12. The method of analyzing a mask used in lithography for defects of claim 1 wherein said set of metrology data comprises specification data including a reflectivity of said mask.

13. The method of analyzing a mask used in lithography for defects of claim 1 wherein said mask comprises a bright field mask design.

14. The method of analyzing a mask used in lithography for defects of claim 1 wherein said mask comprises a dark field mask design.

15. The method of analyzing a mask used in lithography for defects of claim 1 wherein said mask comprises an attenuated phase-shifting mask.

16. The method of analyzing a mask used in lithography for defects of claim 1 wherein said mask comprises a tritone attenuated phase-shifting mask.

17. The method of analyzing a mask used in lithography for defects of claim 1 wherein said mask comprises an alternating phase-shifting mask.

18. The method of analyzing a mask used in lithography for defects of claim 1 wherein said mask comprises an extreme ultraviolet mask.

19. The method of analyzing a mask used in lithography for defects of claim 1, further comprising:
    providing a set of photoresist process parameters as a fourth input; and
    generating a second simulated image in response to said fourth input, wherein said second simulated image comprises a simulation of an image which would be printed on said wafer if said wafer were exposed to said radiation source directed at said portion of said mask, wherein said wafer comprises a coating of photoresist material characterized by said set of photoresist process parameters.

20. The method of analyzing a mask used in lithography for defects of claim 19 wherein said set of photoresist process parameters comprises data representing at least one parameter of a group of parameters including thickness, contrast, pre-bake time, post-bake time, development time, photoresist concentration, developer solution concentration, and light absorption of photoresist.

21. The method of analyzing a mask used in lithography for defects of claim 1 wherein the step of generating said first simulated image has been calibrated to a set of photoresist process parameters such that said first simulated image comprises a simulation of an image which would be printed on said wafer if said wafer were exposed to said radiation source directed at said portion of said mask, wherein said wafer comprises a coating of photoresist material characterized by said set of photoresist process parameters.

22. The method of analyzing a mask used in lithography for defects of claim 19 further comprising:
    providing a set of etching process parameters as a fifth input; and
    generating a third simulated image in response to said fifth input, wherein said third simulated image comprises a simulation of an image which would be transferred on said wafer if said wafer were etched in accordance with said etching process parameters after said exposure to said radiation source.

23. The method of analyzing a mask used in lithography for defects of claim 22 wherein said set of etching process parameters comprises data representing at least one parameter of a group of parameters including etching time, etching method, and concentration.

24. The method of analyzing a mask used in lithography for defects of claim 1 wherein the step of generating said first simulated image has been calibrated to a set of etching process parameters such that said first simulated image comprises a simulation of an image which would be transferred on said wafer if said wafer were etched in accordance with said etching process parameters after said exposure to said radiation source.

25. The method of analyzing a mask used in lithography for defects of claim 1 further comprising:
   providing a reference description of said portion of said mask; and
   providing a reference image, wherein said reference image comprises a representation of an image that would be printed on a wafer if said wafer were exposed to said radiation source directed at a second mask, wherein said second mask comprises a mask described by said reference description.

26. The method of analyzing a mask used in lithography for defects of claim 23 wherein said reference description comprises a physical mask determined to be free from defects.

27. The method of analyzing a mask used in lithography for defects of claim 23 wherein providing said reference image comprises generating said reference image in response to said reference description, wherein said reference image comprises a simulation of an image which would be printed on said wafer if said wafer were exposed to said radiation source directed to said second mask.

28. The method of analyzing a mask used in lithography for defects of claim 27 wherein said reference description comprises data in a format comprising at least one of a group of data formats including GDS-II, MEBES, CFLAT, and digitized data.

29. The method of analyzing a mask used in lithography for defects of claim 25 comprising comparing said first simulated image with said reference image.

30. The method of analyzing a mask used in lithography for defects of claim 29 wherein comparing said first simulated image with said reference image comprises generating a third simulated image which comprises the difference between said first simulated image and said reference image.

31. The method of analyzing a mask using in lithography for defects of claim 29 wherein comparing said first simulated image with said reference image comprises:
   generating a first process window related output in response to said first simulated image;
   generating a second process window related output in response to said reference image; and
   comparing said first process window related output with said second process window related output.

32. The method of analyzing a mask used in lithography for defects of claim 31 wherein generating said first process window related output comprises:
   providing a set of wafer image acceptance criteria; and
   generating a first range of values for at least one parameter comprising said first set of lithography parameters, wherein within range said first simulated image falls one of inside and outside said set of wafer image acceptance criteria.

33. The method of analyzing a mask used in lithography for defects of claim 32 wherein generating said second process window related output comprises:
   generating a second range of values for said at least one parameter comprising said first set of lithography parameters, wherein within said second range said reference image falls one of inside and outside said set of wafer image acceptance criteria.

34. The method of analyzing a mask used in lithography for defects of claim 33 wherein said first set of lithography parameters comprises data representing at least one of a group of parameters including numerical aperture, wavelength, sigma, lens aberration, defocus and critical dimension.

35. The method of analyzing a mask used in lithography for defects of claim 1 comprising analyzing said first simulated image for defects on said mask.

36. The method of analyzing a mask used in lithography for defects of claim 1 further comprising generating a process window related output.

37. The method of analyzing a mask used in lithography for defects of claim 36 wherein generating said process window related output comprises:
   providing a set of wafer image acceptance criteria; and
   generating a range of values for at least one parameter comprising said first set of lithography parameters, wherein within said range said first simulated image falls one of inside and outside said set of wafer image criteria.

38. The method of analyzing a mask used in lithography for defects of claim 37 wherein said first set of lithography parameters comprises data representing at least one of a group of parameters including numerical aperture, wavelength, sigma, lens aberration, defocus and critical dimension.

39. The method of analyzing a mask used in lithography for defects of claim 35 further comprising generating an analysis output, wherein said analysis output comprises a signal which indicates whether said mask one of passed and failed said step of analyzing said first simulated image for defects on said mask.

40. The method of analyzing a mask used in lithography for defects or claim 1 further comprising:
   providing a set of performance criteria for an integrated circuit; and
   generating a performance output in response to said first simulated image and said performance criteria wherein said performance output comprises data indicating an effect of said mask on the performance of said integrated circuit if said mask were to be used in the production of said integrated circuit.

41. The method of analyzing a mask used in lithography for defects of claim 1 wherein said method is performed by a machine executing a program of instructions tangibly embodied in a program storage device readable by said machine.

42. The method of analyzing a mask used in lithography for defects of claim 41 wherein said program storage device comprises a hard disk drive.

43. The method of analyzing a mask used in lithography for defects of claim 41 wherein said program storage device comprises a server.

44. A program storage device readable by a machine, tangibly embodying a program of instructions executable by said machine to perform method steps to analyze a mask used in lithography, the method comprising:

receiving a defect area image as a first input, wherein said defect area image comprises an image of a portion of said mask;

receiving a set of lithography parameters as a second input;

receiving a set of metrology data as a third input; and generating a first simulated image in response to said first input, wherein said first simulated image comprises a simulation of an image which would be printed on a wafer if said wafer were exposed to a radiation source directed at said portion of said mask, wherein the characteristics of said illumination source comprise said set of lithography conditions, and wherein the characteristics of said mask comprise said set of metrology data.

45. The program storage device readable by a machine of claim 44 wherein said generating of said first simulated image has been calibrated to a set of photoresist process parameters such that said first simulated image comprises a simulation of an image which would be printed on said wafer if said wafer were exposed to said radiation source directed through said portion of said mask, wherein said wafer comprises a coating of photoresist material characterized by said set of photoresist process parameters.

46. The program storage device readable by a machine of claim 44 wherein said generating of said first simulated image has been calibrated to a set of etching process parameters such that said first simulated image comprises a simulation of an image which would be transferred on said wafer if said wafer were etched in accordance with said etching process parameters after said exposure to said radiation source.

47. The program storage device readable by a machine of claim 44 wherein the method further comprises:

providing a reference description of said portion of said mask;

providing a reference image, wherein said reference image comprises a simulation of an image that would be printed on a wafer if said wafer were exposed to said radiation source directed at a second mask, wherein said second mask comprises a mask described by said reference description.

48. The program storage device readable by a machine of claim 47 wherein the method further comprises comparing said first simulated image with said reference image.

49. The program storage device readable by a machine of claim 44 wherein said program storage device comprises a hard disk drive.

50. The program storage device readable by a machine of claim 44 wherein said program storage device comprises a server.

51. A method of analyzing a mask used in lithography for defects, the method comprising:

providing a mask inspection tool;

providing a set of potential defect criteria to said mask inspection tool;

scanning said mask with said mask inspection tool for features whose characteristics fall within said set of potential defect criteria;

generating a defect area image as a first input, wherein said defect area image comprises an image of a portion of said mask which contains a potential defect;

providing a set of lithography parameters as a second input;

providing a set of metrology data as a third input; and generating a first simulated image with said simulator apparatus in response to said first input, wherein said first simulated image comprises a simulation of an image which would be printed on a wafer if said wafer were exposed to a radiation source directed at said portion of said mask, wherein the characteristics of said radiation source comprise said set of lithography conditions, and wherein the characteristics of said mask comprise said set of metrology data.

52. The method of analyzing a mask used in lithography for defects of claim 51 comprising:

providing a reference description of said portion of said mask as a fourth input;

providing a reference image, wherein said reference image comprises a simulation of an image that would be printed on said wafer if said wafer were exposed to said radiation source directed at a second mask, wherein said second mask comprises a mask described by said reference description; and comparing said first simulated image with said reference image.

53. A computer program product comprising:

a computer usable medium having a computer readable program code embodied therein for causing a computer to analyze a mask used in lithography for defects, the computer readable program code comprising:

computer readable program code that reads a defect area image of a portion of said mask as a first input;

computer readable program code that reads a set of lithography parameters as a second input;

computer readable program code that reads a set of metrology data as a third input; and computer readable program code that generates a first simulated image in response to said first input, wherein said first simulated image comprises a simulation of an image which would be printed on a water if said wafer were exposed to a radiation source directed to said portion of said mask, wherein the characteristics of said radiation source comprise said set of lithography conditions, wherein the characteristics of said mask comprise said set of metrology data.

54. The computer program product of claim 53 wherein said computer readable program code that generates said first simulated image has been calibrated to a set of photoresist process parameters such that said first simulated image comprises a simulation of an image which would be printed on said wafer if said wafer were exposed to said radiation source directed at said portion of said mask, wherein said wafer comprises a coating of photoresist material characterized by said set of photoresist process parameters.

55. The computer program product of claim 53 wherein said computer readable program code that generates said first simulated image has been calibrated to a set of etching process parameters such that said first simulated image comprises a simulation of an image which would be transferred on said wafer if said wafer were etched in accordance with said etching process parameters after said exposure to said radiation source.

56. The computer program product of claim 53 comprising:

computer readable program code that receives a reference description of said portion of said mask; and computer readable program code that provides a reference image, wherein said reference image comprises a simulation of an image that would be printed on a wafer if said wafer were exposed to said radiation source directed at a second mask, wherein said second mask comprises a mask described by said reference description.

57. The computer program product of claim 56 comprising computer readable program code that compares said first simulated image with said reference image.

58. The computer program product of claim 53 comprising a computer readable program code that analyzes said first simulated image for defects on said mask.

59. The computer program product of claim 53 wherein said computer usable medium comprises a hard disk drive.

60. The computer program product of claim 53 wherein said computer usable medium comprises a server.

* * * * *

UNITED STATES PATENT AND TRADEMARK OFFICE
CERTIFICATE OF CORRECTION

PATENT NO.         : 7,107,571 B2                                                     Page 1 of 1
APPLICATION NO.    : 09/906920
DATED              : September 12, 2006
INVENTOR(S)        : Fang-Cheng Chang et al.

It is certified that error appears in the above-identified patent and that said Letters Patent is hereby corrected as shown below:

Column 31, line 55, replace "nonvisible" with -- non-visible --.

Column 36, line 40, replace "water" with -- wafer --.

Signed and Sealed this

First Day of May, 2007

JON W. DUDAS
*Director of the United States Patent and Trademark Office*